US009147487B2

(12) United States Patent
Chen et al.

(10) Patent No.: US 9,147,487 B2
(45) Date of Patent: Sep. 29, 2015

(54) MEMORY DEVICE AND METHOD FOR PROGRAMMING MEMORY CELL OF MEMORY DEVICE

(71) Applicant: MACRONIX INTERNATIONAL CO., LTD., Hsinchu (TW)

(72) Inventors: Chung-Kuang Chen, Hsinchu (TW); Han-Sung Chen, Hsinchu (TW); Chun-Hsiung Hung, Hsinchu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 341 days.

(21) Appl. No.: 13/688,623

(22) Filed: Nov. 29, 2012

(65) Prior Publication Data

US 2014/0146611 A1 May 29, 2014

(51) Int. Cl.
*G11C 16/04* (2006.01)
*G11C 16/30* (2006.01)
*G11C 11/56* (2006.01)
*G11C 16/24* (2006.01)
*G11C 16/34* (2006.01)

(52) U.S. Cl.
CPC ............ *G11C 16/30* (2013.01); *G11C 11/5628* (2013.01); *G11C 16/24* (2013.01); *G11C 16/34* (2013.01); *G11C 16/3427* (2013.01); *G11C 16/3436* (2013.01); *G11C 16/3454* (2013.01)

(58) Field of Classification Search
CPC .... G11C 16/30; G11C 16/34; G11C 16/3427; G11C 16/3436; G11C 16/3454
USPC .......................... 365/185.02, 185.19, 185.18
See application file for complete search history.

(56) References Cited

U.S. PATENT DOCUMENTS

| 7,397,705 B1 * | 7/2008 | Huang et al. ............. 365/185.28 |
| 7,532,522 B2 * | 5/2009 | Hsu et al. ................. 365/189.09 |
| 2009/0003054 A1 * | 1/2009 | Hung et al. ............... 365/185.03 |
| 2009/0122616 A1 * | 5/2009 | Jang et al. ................ 365/185.22 |
| 2012/0239858 A1 * | 9/2012 | Melik-Martirosian ....... 711/103 |
| 2013/0088916 A1 * | 4/2013 | Sarpatwari et al. ...... 365/185.02 |

* cited by examiner

Primary Examiner — Toan Le
(74) Attorney, Agent, or Firm — Volpe and Koenig, P.C.

(57) ABSTRACT

A method for programming a memory cell of a memory device includes the following steps. A plurality of cycle number ranges are set up. A specific one of the plurality of cycle number ranges, in which the memory cell having a drain terminal passes a program-verification, is determined. A bias voltage is applied to the drain terminal for programming the memory cell, wherein the bias voltage varies with the specific cycle number range.

20 Claims, 13 Drawing Sheets

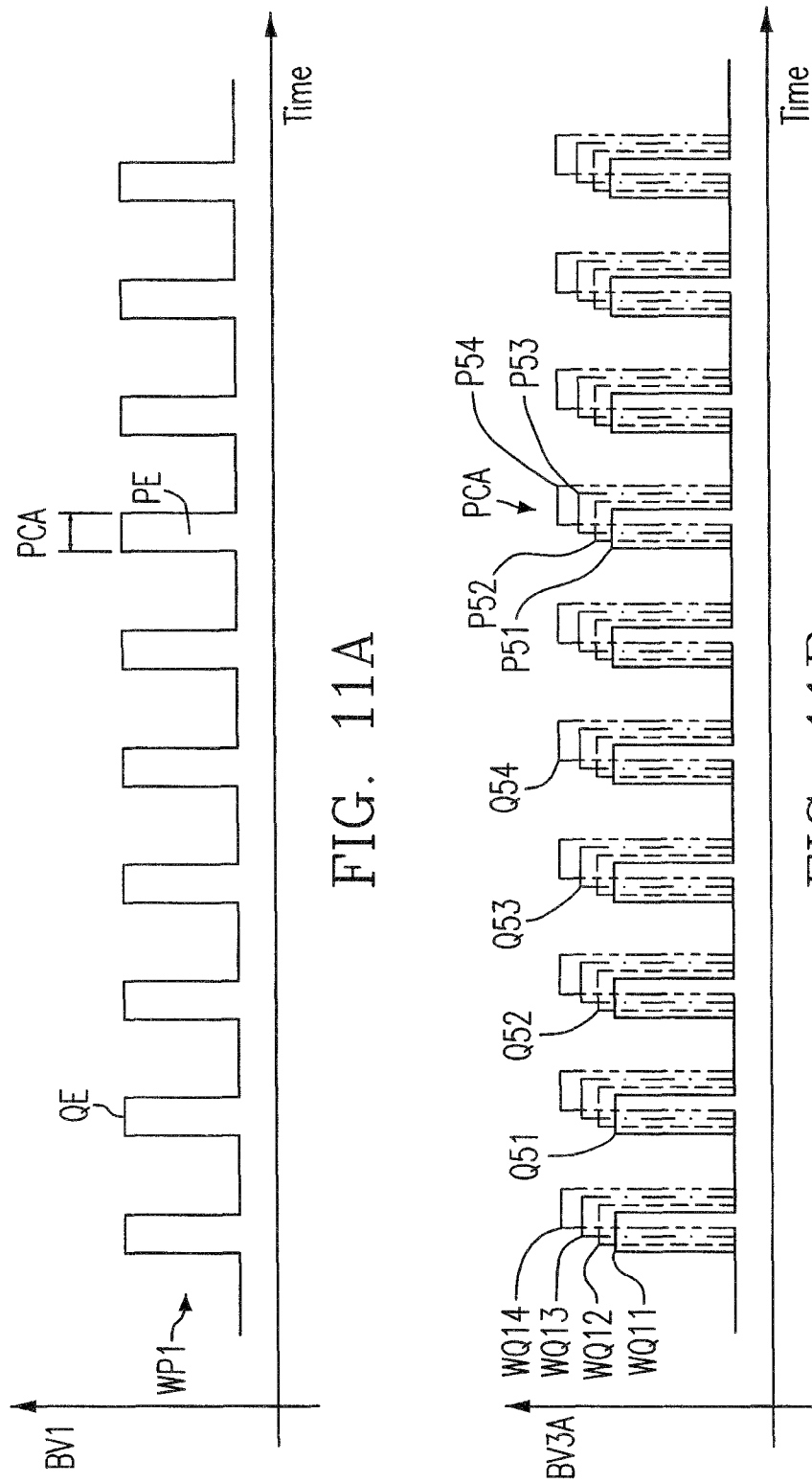

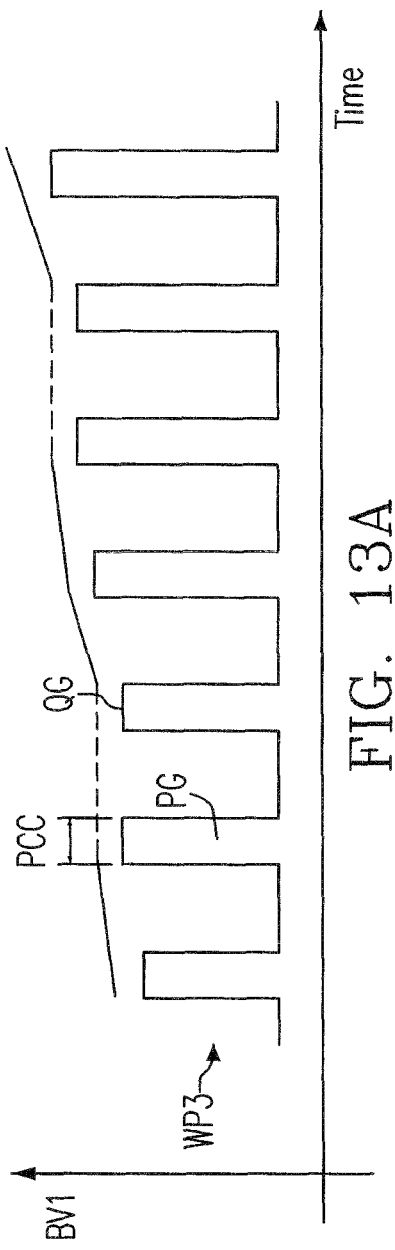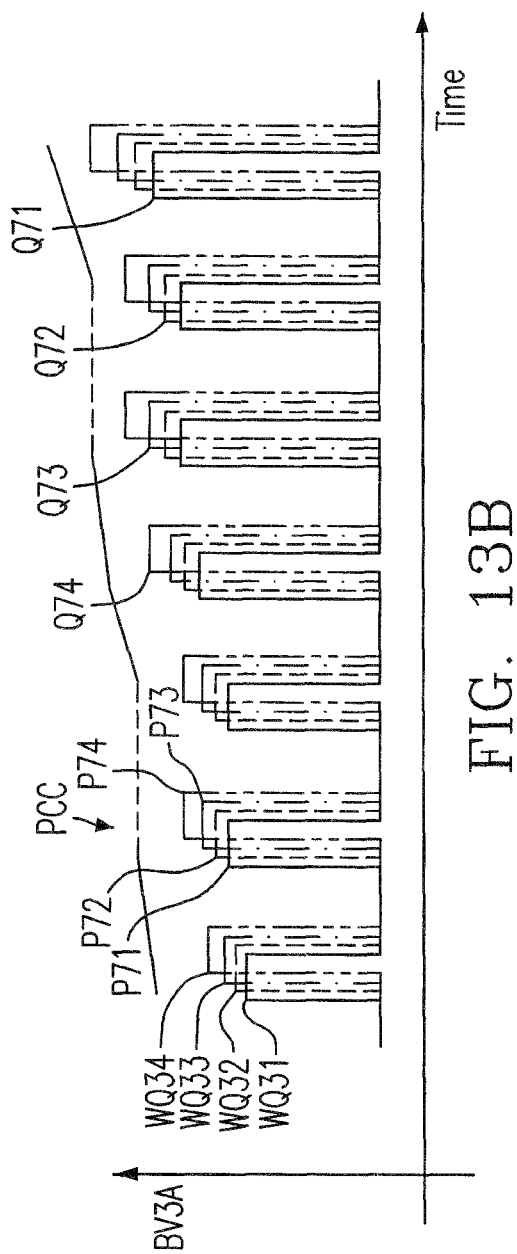

MEMORY DEVICE AND METHOD FOR PROGRAMMING MEMORY CELL OF MEMORY DEVICE

TECHNICAL FIELD

Embodiments of the present disclosure relate generally to a non-volatile memory and, more particularly, relate to a memory device and method for programming a charge-trapping memory cell.

BACKGROUND

In the prior art, a flash memory cell stores a charge in a floating gate. The stored charge changes a threshold voltage of the memory cell. In a read operation, a read voltage is applied to the gate terminal of the memory cell, and the corresponding indication about whether the memory cell turns on (e.g., a drain current) indicates the programming state of the memory cell. For instance, a memory cell that conducts current during the read operation may have a digital value of "1" assigned; and a memory cell that does not conduct current during the read operation may have a digital value of "0" assigned. A charge may be added to or removed from the floating gate to correspondingly program or erase the memory cell (e.g., to change the memory cell value from "1" to "0").

Another type of memory cell employs a charge-trapping structure rather than a conductive gate material employed in the floating gate devices. The memory cell includes a charge-trapping layer. When the charge-trapping layer is programmed, a charge may be trapped in the charge-trapping layer, so that the charge does not move through the non-conductive charge-trapping layer. The charge may therefore be retained by the charge-trapping layer until the memory cell is erased, thereby retaining the data state without requiring a continuous source of electrical power to be applied. The charge-trapping memory cell can be operated as a two-sided cell. In other words, because the charge does not move through the non-conductive charge trapping layer, the charge can be localized on different charge-trapping sites. Therefore, a charge-trapping memory cell serving as a multi-bit cell (MBC) or a multi-level cell (MLC) can be created, which can increase the amount of data that can be stored in a memory device without consuming more space.

An MLC has a first bit site and a second bit site for saving two bits of data, wherein each of the first and the second bit sites can store a bit of data. A selected one of the first and the second bit sites has a neighbor bit site. The electric charge of the neighbor bit site can affect the selected bit site. In other words, if the first bit site is previously programmed in a state of a high threshold voltage, the speed of programming the second bit site will be slowed down; i.e. there is a neighbor bit disturb (or a program disturb) when programming the second bit site. There are numerous mechanisms that have been developed in an effort to consider the neighbor bit disturb and the program performance. Some of these mechanisms involve the application of different voltages to the source lines, the bit lines or the word lines. Thus, it may be desirable to provide an improved mechanism for programming a multi-level cell.

SUMMARY OF EXEMPLARY EMBODIMENTS

It is therefore an embodiment of the present disclosure to provide a method for programming a memory cell of a memory device. The method includes the following steps. A plurality of cycle number ranges are set up. A specific one of the plurality of cycle number ranges, in which the memory cell having a drain terminal passes a program-verification, is determined. A bias voltage is applied to the drain terminal for programming the memory cell, wherein the bias voltage varies with the specific cycle number range.

It is therefore another embodiment of the present disclosure to provide a memory device. The memory device includes a memory cell and a bias circuit. The bias circuit has a controllable channel, receives a plurality of bias voltages different from one another, and allows a specific one of the plurality of bias voltages to enable the controllable channel for programming the memory cell.

It is therefore still another embodiment of the present disclosure to provide a method for programming a memory cell of a memory device. The method includes the following steps. A plurality of cycle number ranges are set up. A specific one of the plurality of cycle number ranges, in which the memory cell having a drain terminal passes a program-verification, is determined.

BRIEF DESCRIPTION OF THE DRAWINGS

The foregoing and other features and advantages of the present disclosure will be more clearly understood through the following descriptions with reference to the drawings, wherein:

FIG. 11A is a schematic diagram showing a waveform of a drain bias voltage obtained from the memory device in FIG. 3 under a first condition according to one embodiment of the present disclosure;

FIG. 11B is a schematic diagram showing four waveforms of a drain bias voltage obtained from the memory device in FIG. 9 or FIG. 10 under a second condition associated with the first condition according to one embodiment of the present disclosure;

FIG. 13A is a schematic diagram showing a waveform of the drain bias voltage obtained from the memory device in FIG. 3 under a fifth condition according to one embodiment of the present disclosure; and FIG. 13B is a schematic diagram showing four waveforms of a drain bias voltage obtained from the memory device in FIG. 9 or FIG. 10 under a sixth condition associated with the fifth condition according to one embodiment of the present disclosure.

DETAIL DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; it is not intended to be exhaustive or to be limited to the precise form disclosed.

Figure 1:
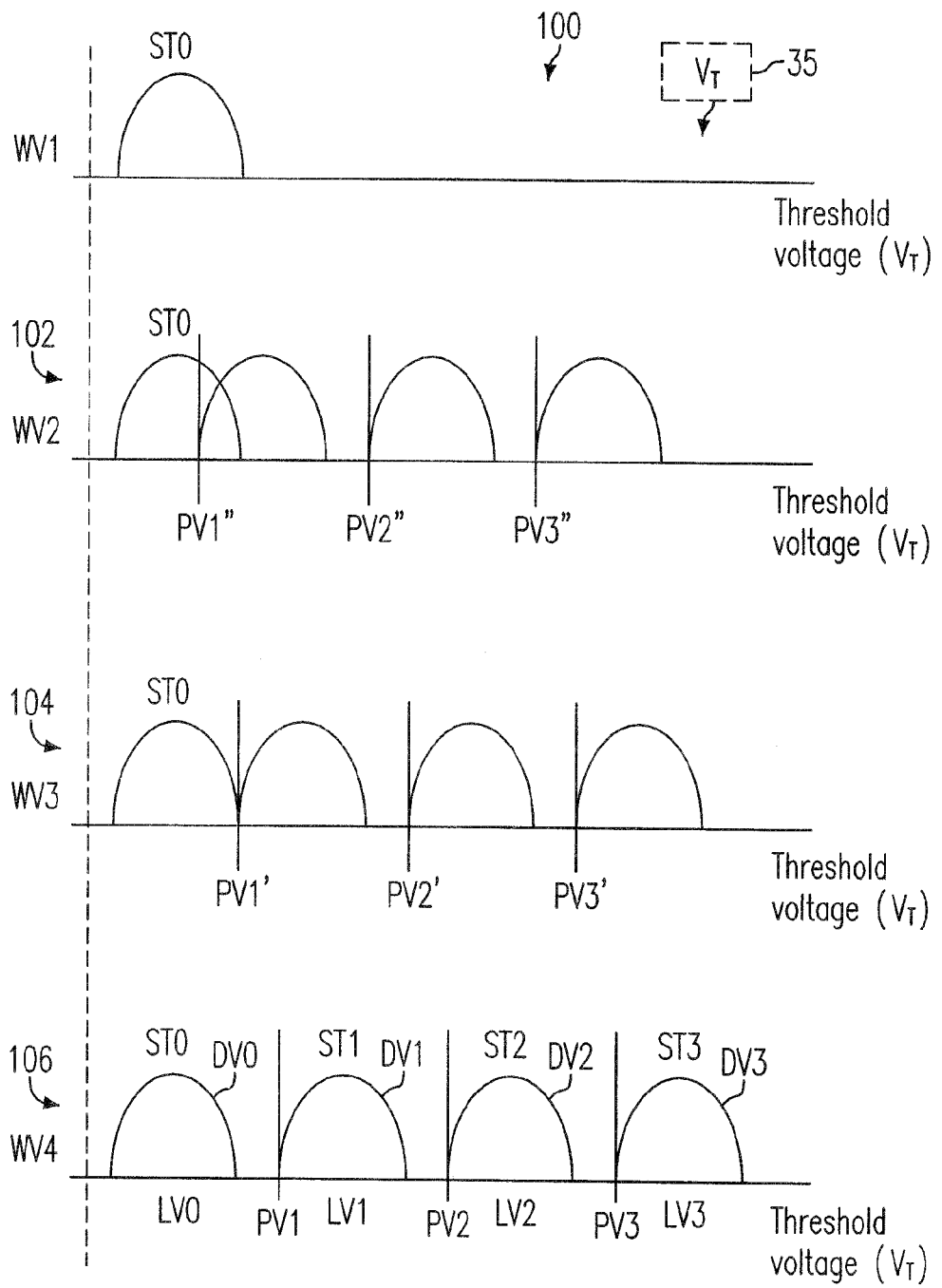
FIG. 1 is a schematic diagram showing waveforms representing a three-phase programming method according to one embodiment of the present disclosure.

FIG. 1 is a schematic diagram showing waveforms WV1, WV2, WV3 and WV4 representing a three-phase programming method 100 according to one embodiment of the present disclosure. The three-phase programming method 100 is employed to a memory cell 35, such as a non-volatile multi-level cell (MLC) or a charge-trapping memory cell. The memory cell 35 has a threshold voltage $V_T$ and four states ST0, ST1, ST2 and ST3. The threshold voltage $V_T$ has four threshold voltage levels (or program levels) LV0, LV1, LV2 and LV3. The threshold voltage $V_T$ has the threshold voltage level LV0 when the memory cell 35 in the state ST0. The threshold voltage $V_T$ has the threshold voltage level LV1 when the memory cell 35 in the state ST1. The threshold voltage $V_T$ has the threshold voltage level LV2 when the memory cell 35 in the state ST2. The threshold voltage $V_T$ has the threshold voltage level LV3 when the memory cell 35 in the state ST3. The threshold voltage levels LV0, LV1, LV2 and LV3 correspond to four threshold voltage distributions DV0, DV1, DV2 and DV3, respectively, and can be represented in binary formats as "11", "01", "10", and "00", respectively.

The memory cell 35 has the threshold voltage level LV0 when the memory cell 35 is reset or erased. The waveform WV1 shows a first threshold voltage configuration about the threshold voltage level LV0. The threshold voltage level LV1 is higher than the threshold voltage level LV0; the threshold voltage level LV2 is higher than the threshold voltage level LV1; and the threshold voltage level LV3 is higher than the threshold voltage level LV2. The three-phase programming method 100 is employed to program the memory cell 35 from one of the states ST0, ST1, ST2 and ST3 to another one of the states ST0, ST1, ST2 and ST3.

The waveform WV2 shows a second threshold voltage configuration for a first-phase program process 102 of the memory cell 35. During the first-phase program process 102, there is a first specific one of three program-verification levels PV1", PV2" and PV3". The program-verification levels PV1", PV2" and PV3" are associated with the threshold voltage levels LV1, LV2 and LV3, respectively.

The waveform WV3 shows a third threshold voltage configuration for a second-phase program process 104 of the memory cell 35. During the second-phase program process 104, there is a second specific one of three program-verification levels PV1', PV2' and PV3'. The second specific program-verification level corresponds to the first specific program-verification level. The program-verification levels PV1', PV2' and PV3' are associated with the threshold voltage levels LV1, LV2 and LV3, respectively.

The waveform WV4 shows a fourth threshold voltage configuration for a third-phase program process 106 of the memory cell 35. During the third-phase program process 106, there is a third specific one of three program-verification levels PV1, PV2 and PV3. The third specific program-verification level corresponds to the first specific program-verification level. The program-verification levels PV1, PV2 and PV3 are associated with the threshold voltage levels LV1, LV2 and LV3, respectively, and are three final program-verify levels, respectively.

The program-verification levels PV1", PV2" and PV3" are set to be lower than the program-verification levels PV1', PV2' and PV3', respectively. The program-verification levels PV1', PV2' and PV3' are set to be lower than the program-verification levels PV1, PV2 and PV3, respectively. For instance, the program-verification levels PV1", PV2", PV3", PV1', PV2' and PV3' are specific program-verification levels, respectively; and the program-verification levels PV1, PV2 and PV3 are predetermined program-verification levels, respectively. The first-phase and the second-phase program processes 102 and 104 have lower program-verification levels to prevent the neighbor bit disturb (or the program disturb). The three-phase programming method 100 includes the following steps: the first-phase program process 102 is performed; the second-phase program process 104 is performed; and the third-phase program process 106 is performed.

Figure 2:
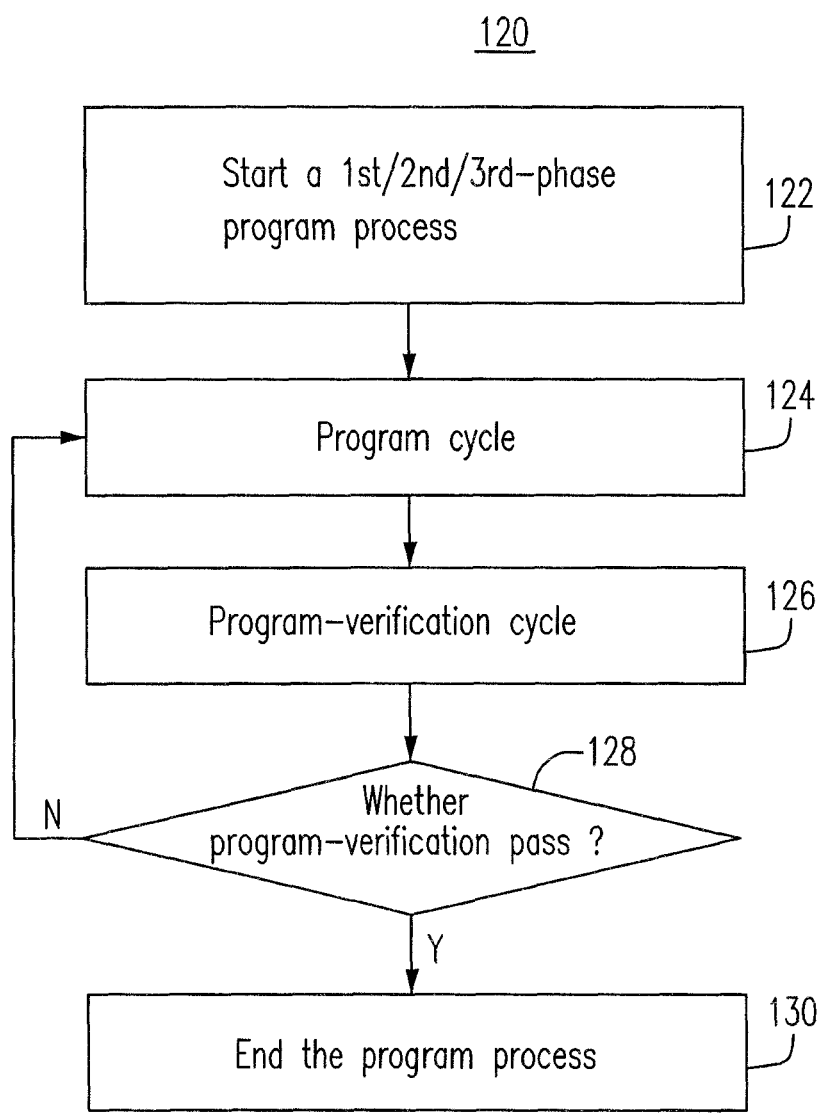
FIG. 2 is a flow diagram showing a method for programming a memory cell according to one embodiment of the present disclosure.

FIG. 2 is a flow diagram showing a method 120 for programming the memory cell 35 according to one embodiment of the present disclosure. The method 120 is applied to the first-phase, the second-phase and the third-phase program processes 102, 104 and 106. In step 122, one selected from the first-phase, the second-phase and the third-phase program processes 102, 104 and 106 is started. In step 124, the memory cell 35 is programmed in a program cycle. In the program cycle, a first pulse is applied to the gate terminal of the memory cell 35, and a second pulse is applied to the drain terminal of the memory cell 35, so that the threshold voltage of the memory cell 35 can be changed. In step 126, a program-verification to the memory cell 35 is performed in a program-verification cycle according to a program-verification level. In step 128, it is made a decision about whether the program-verification passes. The step flow goes back to step 124 when the decision is negative (N). The step flow proceeds to step 130 when the decision is positive (Y). In step 130, the selected program is ended.

Figure 3:
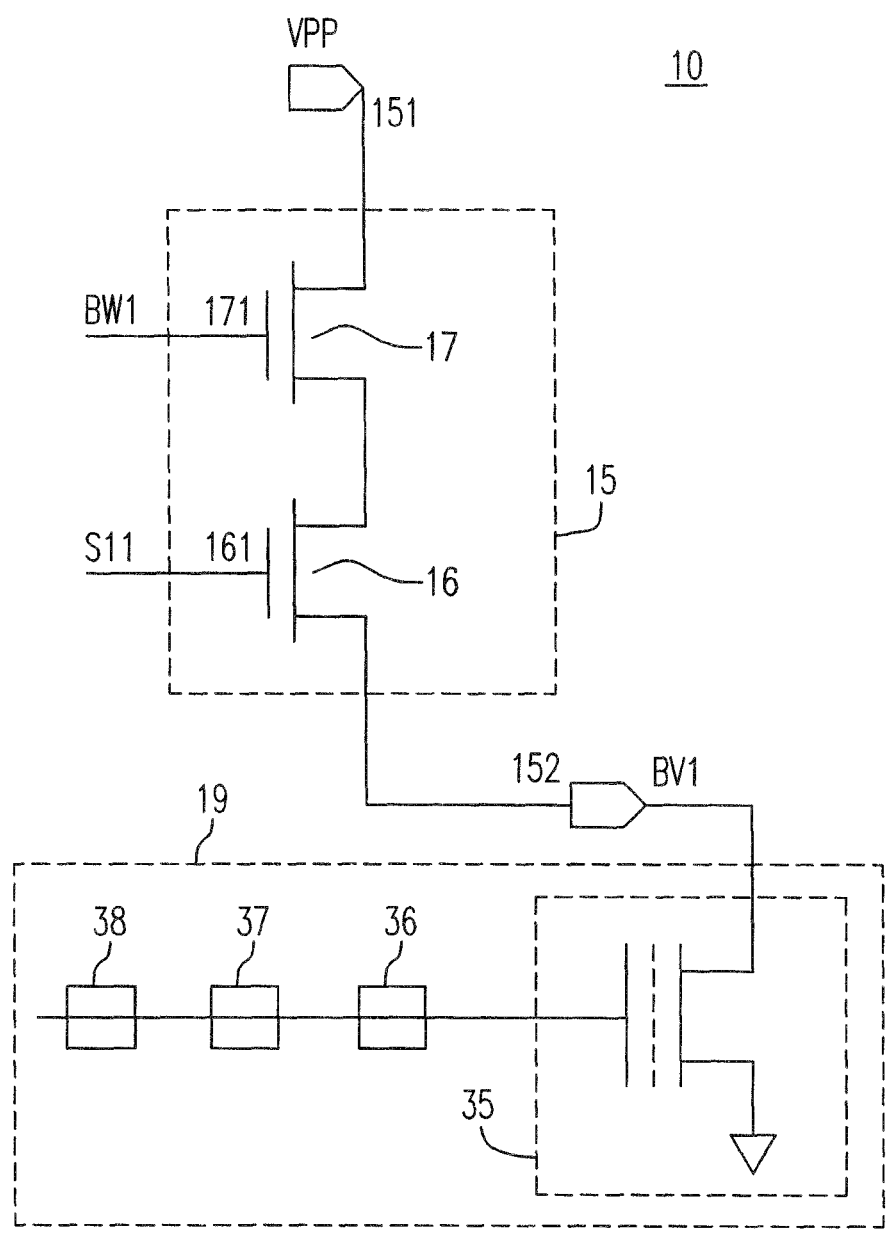
FIG. 3 is a schematic diagram showing a memory device according to one embodiment of the present disclosure.

FIG. 3 is a schematic diagram showing a memory device 10 according to one embodiment of the present disclosure. The memory device 10 includes a simplified drain bias circuit 15 and a memory cell 35 coupled to the drain bias circuit 15. The drain bias circuit 15 includes a switch 16, a transistor 17, a power input terminal 151 and an output terminal 152. The switch 16 is connected in series with the transistor 16. The power input terminal 151 receives a programming reference voltage VPP. The switch 16 includes a control terminal 161 receiving a program data signal S11, wherein the switch 16 is a pass transistor, and the program data signal S11 is an enable signal or a pulse signal. The transistor 17 includes a control terminal 171 receiving a bias voltage BW1. The output terminal 152 transmits a drain bias voltage BV1 to a drain terminal of the memory cell 35, wherein the drain bias voltage BV1 includes a programming pulse train having a specific pulse. For instance, the specific pulse is the second pulse. In one embodiment, the memory device 10 includes a memory block 19 including a plurality of memory cells 35, 36, 37 and 38. For instance, the plurality of memory cells 35, 36, 37 and 38 are connected to the same word line.

Figure 4:
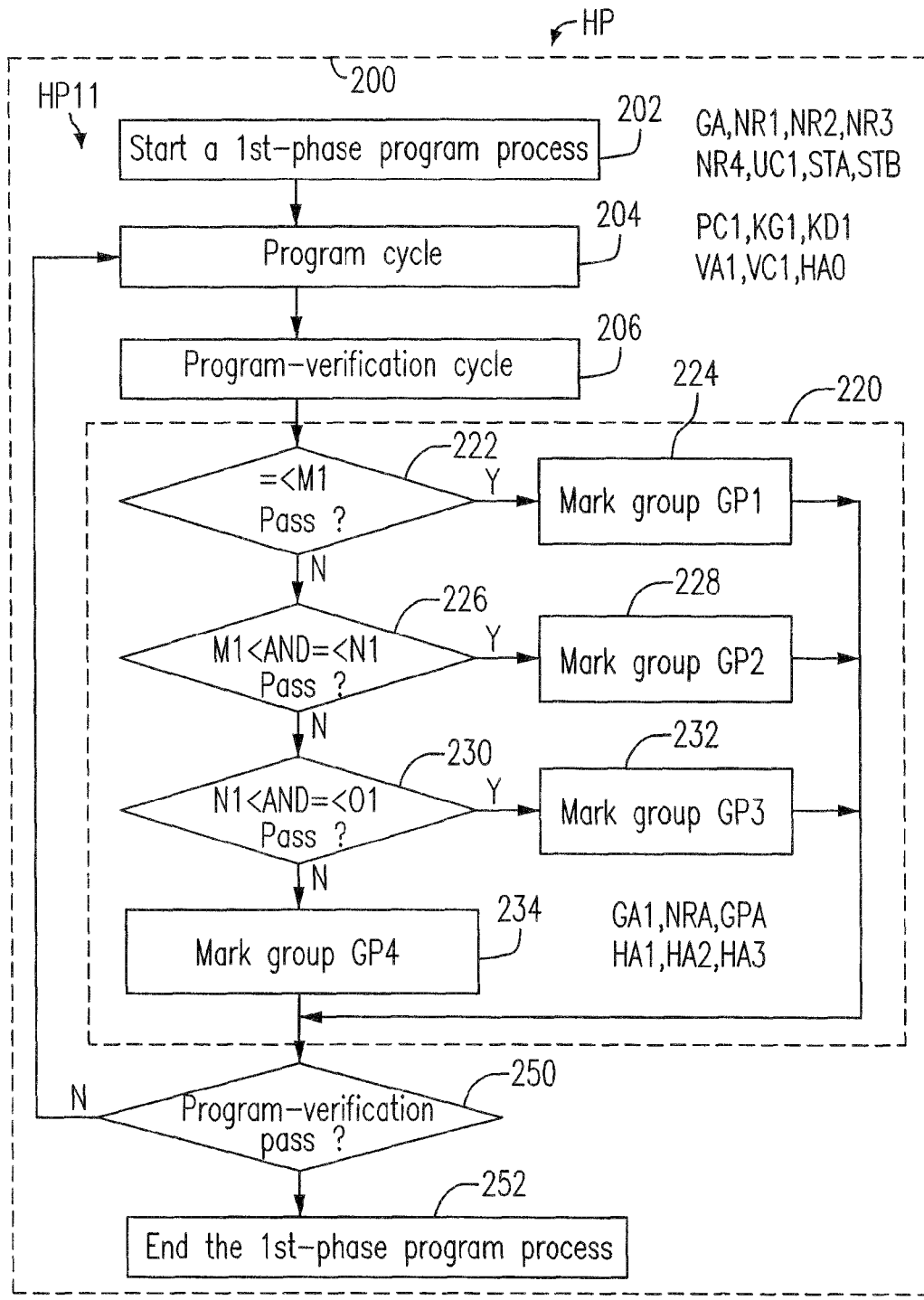
FIG. 4 is a flow diagram showing a method serving as a first-phase program process according to one embodiment of the present disclosure.

FIG. 4 is a flow diagram showing a method 200 serving as a first-phase program process HP11 according to one embodiment of the present disclosure. In step 202, a grouping information GA, a plurality of cycle number ranges NR1, NR2, NR3 and NR4, and a plurality of memory cell groups GP1, GP2, GP3 and GP4 are preset up, a current program-verification cycle number UC1 is preset to be a number of 0, and the first-phase program process HP11 is started. The memory cell 35 has threshold voltage $V_T$ and states ST0, ST1, ST2 and ST3. The threshold voltage $V_T$ has threshold voltage levels (or program levels) LV0, LV1, LV2 and LV3 corresponding to the states ST0, ST1, ST2 and ST3, respectively. The first-phase program process HP11 is a partial process of a program process HP. The program process HP is employed to program the memory cell 35 from a specific one STA of the states ST0, ST1, ST2 and ST3 to a specific one STB of the states ST0, ST1, ST2 and ST3, wherein the specific state STB being a destination state is different from the specific state STA being a source state.

In step 204, the memory cell 35 is programmed in a program cycle PC1, wherein the memory cell 35 may be a multi-level cell or a charge-trapping memory cell. For instance, in the program cycle PC1, a pulse KG1 is applied to the gate terminal of the memory cell 35, a pulse KD1 is applied to the drain terminal of the memory cell 35, and the source terminal of the memory cell 35 is coupled to the ground, so that the threshold voltage $V_T$ of the memory cell 35 can be increased.

In step 206, the current program-verification cycle number UC1 is increased by 1, a program-verification VA1 to the memory cell 35 is performed in a program-verification cycle VC1 according to a program-verification level PV'', and it is made a decision HA0 about whether the program-verification VA1 passes. For instance, the memory cell 35 is compared to a reference representative having the program-verification level PV'' corresponding to the specific state STB, wherein the program-verification level PV'' may be one of the program-verification levels PV1'', PV2'' and PV3''.

In the process 220, the grouping information GA is caused to have a mark GA1, which is set according to the current program-verification cycle number UC1 and a plurality of cycle number ranges NR1, NR2, NR3 and NR4. The mark GA1 is set to correlate with a specific one NRA of the plurality of cycle number ranges NR1, NR2, NR3 and NR4, and indicates that the memory cell 35 belongs to a specific one GPA of the plurality of memory cell groups GP1, GP2, GP3 and GP4; i.e. the specific cycle number range NRA corresponds to the specific memory cell group GPA. The process 220 includes steps 222, 224, 226, 228, 230, 232 and 234.

In step 222, it is made a decision HA1 about whether the decision HA0 is positive (Y) and the current program-verification cycle number UC1 is within the cycle number range NR1. For instance, the cycle number range NR1 is a first integer range, which is greater than a specific integer of 0 and is less than or equal to a specific integer M1. The step flow proceeds to step 224 when the decision HA1 is positive (Y). The step flow proceeds to step 226 when the decision HA1 is negative (N). In step 224, the mark GA1 is set to indicate that the memory cell 35 join the memory cell group GP1; i.e., the specific cycle number range NRA is set to be equal to the cycle number range NR1, and the specific memory cell group GPA is set to be equal to the memory cell group GP1.

In step 226, it is made a decision HA2 about whether the decision HA0 is positive and the current program-verification cycle number UC1 is within the cycle number range NR2. For instance, the cycle number range NR2 is a second integer range, which is greater than the specific integer M1 and is less than or equal to a specific integer N1. The step flow proceeds to step 228 when the decision HA2 is positive. The step flow proceeds to step 230 when the decision HA2 is negative (N). In step 228, the mark GA1 is set to indicate that the memory cell 35 join the memory cell group GP2; i.e., the specific cycle number range NRA is set to be equal to the cycle number range NR2, and the specific memory cell group GPA is set to be equal to the memory cell group GP2.

In step 230, it is made a decision HA3 about whether the decision HA0 is positive and the current program-verification cycle number UC1 is within the cycle number range NR3. For instance, the cycle number range NR3 is a third integer range, which is greater than the specific integer N1 and is less than or equal to a specific integer O1. The step flow proceeds to step 232 when the decision HA3 is positive. The step flow proceeds to step 234 when the decision HA3 is negative. In step 232, the mark GA1 is set to indicate that the memory cell 35 join the memory cell group GP3; i.e., the specific cycle number range NRA is set to be equal to the cycle number range NR3, and the specific memory cell group GPA is set to be equal to the memory cell group GP3.

In step 234, the mark GA1 is set to indicate that the memory cell 35 join the memory cell group GP4; i.e., the specific cycle number range NRA is set to be equal to the cycle number range NR4, and the specific memory cell group GPA is set to be equal to the memory cell group GP4. In step 234, there is a condition the current program-verification cycle number UC1 is within the cycle number range NR4. For instance, the cycle number range NR4 is a fourth integer range, which is greater than the specific integer O1.

In step 250, the step flow proceeds to step 252 when the decision HA0 is positive, and the step flow go back to step 204 when the decision HA0 is negative. In step 252, the first-phase program process HP11 is ended. The memory device 10 in FIG. 3 includes a memory block 19 including a plurality of memory cells 35, 36, 37 and 38. The method 200 may be applied to each of the plurality of memory cells 35, 36, 37 and 38. The grouping information GA further has marks GA2, GA3 and GA4 corresponding to the memory cells 36, 37 and 38, respectively. For instance, the plurality of memory cells 35, 36, 37 and 38 are connected to the same word line. In one embodiment, the method 200 may be applied to a memory cell the destination state of which is different from the state ST0.

Figure 5:
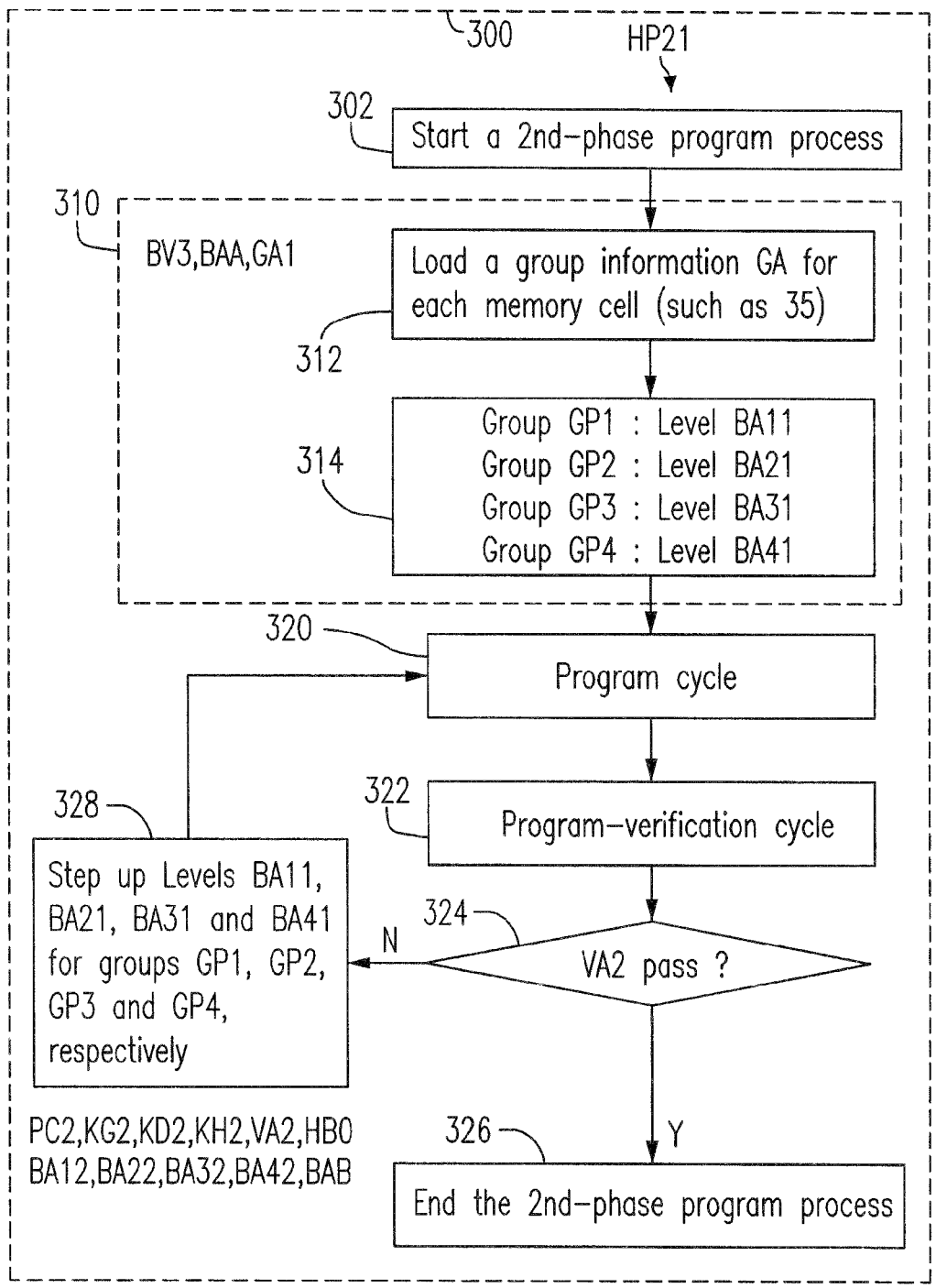
FIG. 5 is a flow diagram showing a method serving as a second-phase program process according to one embodiment of the present disclosure.

FIG. 5 is a flow diagram showing a method 300 serving as a second-phase program process HP21 according to one embodiment of the present disclosure. In step 302, the second-phase program process HP21 is started.

In the process 310, a bias voltage BV3 (corresponding to the drain bias voltage BV1 in FIG. 3) is provided to the drain terminal of the memory cell 35 according to the grouping information GA. The process 310 includes steps 312 and 314. In step 312, the grouping information GA is loaded for each memory cell (such as the memory cell 35) to be programmed in the memory block 19.

In step 314, the bias voltage BV3 for programming the memory cell 35 is caused to have a specific one BAA of a plurality of bias voltage levels BA11, BA21, BA31 and BA41 according to the mark GA1. The plurality of bias voltage levels BA11, BA21, BA31 and BA41 are different from one another. The specific bias voltage level BAA is the bias voltage level BA11 when the mark GA1 indicates that the memory cell 35 belongs to the memory cell group GP1. The specific bias voltage level BAA is the bias voltage level BA21 when the mark GA1 indicates that the memory cell 35 belongs to the memory cell group GP2. The specific bias voltage level BAA is the bias voltage level BA31 when the mark GA1 indicates that the memory cell 35 belongs to the memory cell group GP3. The specific bias voltage level BAA is the bias voltage level BA41 when the mark GA1 indicates that the memory cell 35 belongs to the memory cell group GP4. For instance, one of a step-up condition and a level-fixed condition is preset; and each of plurality of bias voltage levels BA11, BA21, BA31 and BA41 can be stepped up when the step-up condition is preset, or can be fixed when the level-fixed condition is preset.

In step 320, the memory cell 35 is programmed in a program cycle PC2. For instance, in the program cycle PC2, a pulse KG2 is applied to the gate terminal of the memory cell 35, a pulse KD2 having a pulse height KH2 equal to the specific bias voltage level BAA is applied to the drain terminal of the memory cell 35, and the source terminal of the memory cell 35 is coupled to the ground, so that the threshold voltage $V_T$ of the memory cell 35 can be increased. For instance, a pulse height of the pulse KG2 may be higher than a pulse height of the pulse KG1.

In step 322, a program-verification VA2 to the memory cell 35 is performed in a program-verification cycle VC2 according to a program-verification level PV', and it is made a decision HB0 about whether the program-verification VA2 passes. For instance, the memory cell 35 is compared to a reference representative having the program-verification level PV' corresponding to the specific state STB, wherein the program-verification level PV' may be one of the program-verification levels PV1', PV2' and PV3'.

In step 324, the step flow proceeds to step 326 when the decision HB0 is positive, and the step flow proceeds to step 328 when the decision HB0 is negative. In step 326, the second-phase program process HP21 is ended.

In step 328, the plurality of bias voltage levels BA11, BA21, BA31 and BA41 are stepped up to a plurality of bias voltage levels BA12, BA22, BA32 and BA42, respectively, the bias voltage BV3 for programming the memory cell 35 is caused to have a specific one BAB of the plurality of bias voltage levels BA12, BA22, BA32 and BA42 according to the mark GA1, and the step flow goes back to step 320. The plurality of bias voltage levels BA12, BA22, BA32 and BA42 are different from one another. The specific bias voltage level BAB is the bias voltage level BA12 (BA22, BA32 or BA42 in order) when the mark GA1 indicates that the memory cell 35 belongs to the memory cell group GP1 (GP2, GP3 or GP4 in order). For instance, step 328 may be performed when the step-up condition is preset; and the plurality of bias voltage levels BA12, BA22, BA32 and BA42 may be equal to the plurality of bias voltage levels BA11, BA21, BA31 and BA41, respectively, when the level-fixed condition is preset.

In one embodiment, the method 300 may be applied to each of the plurality of memory cells 35, 36, 37 and 38. In one embodiment, the method 300 may be applied to a memory cell the destination state of which is different from the state ST0.

Figure 6:
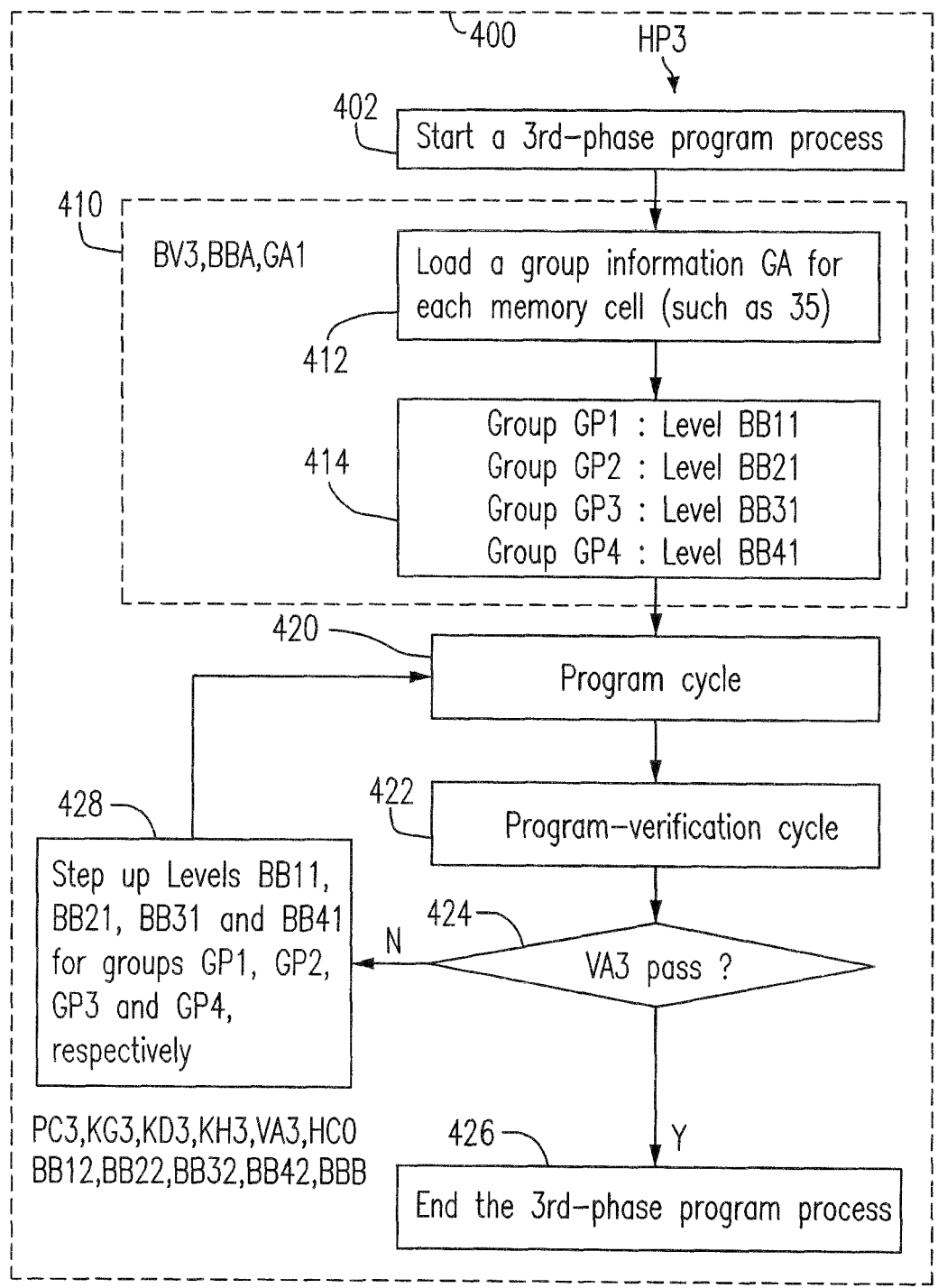
FIG. 6 is a flow diagram showing a method serving as a third-phase program process according to one embodiment of the present disclosure.

FIG. 6 is a flow diagram showing a method 400 serving as a third-phase program process HP3 according to one embodiment of the present disclosure. In step 402, the third-phase program process HP3 is started.

In the process 410, a bias voltage BV3 (corresponding to the drain bias voltage BV1 in FIG. 3) is provided to the drain terminal of the memory cell 35 according to the grouping information GA. The process 410 includes steps 412 and 414.

In step 412, the grouping information GA is loaded for each memory cell (such as the memory cell 35) to be programmed in the memory block 19.

In step 414, the bias voltage BV3 for programming the memory cell 35 is caused to have a specific one BBA of a plurality of bias voltage levels BB11, BB21, BB31 and BB41 according to the mark GA1. The plurality of bias voltage levels BB11, BB21, BB31 and BB41 are different from one another. The specific bias voltage level BBA is the bias voltage level BB11 (BB21, BB31 or BB41 in order) when the mark GA1 indicates that the memory cell 35 belongs to the memory cell group GP1 (GP2, GP3 or GP4 in order). The plurality of bias voltage levels BB11, BB21, BB31 and BB41 may be higher than or equal to the plurality of bias voltage levels BA11, BA21, BA31 and BA41, respectively. For instance, one of a step-up condition and a level-fixed condition is preset; and each of plurality of bias voltage levels BB11, BB21, BB31 and BB41 can be stepped up when the step-up condition is preset, or can be fixed when the level-fixed condition is preset.

In step 420, the memory cell 35 is programmed in a program cycle PC3. For instance, in the program cycle PC3, a pulse KG3 is applied to the gate terminal of the memory cell 35, a pulse KD3 having a pulse height KH3 equal to the specific bias voltage level BBA is applied to the drain terminal of the memory cell 35, and the source terminal of the memory cell 35 is coupled to the ground, so that the threshold voltage $V_T$ of the memory cell 35 can be increased. For instance, a pulse height of the pulse KG3 may be higher than a pulse height of the pulse KG2.

In step 422, a program-verification VA3 to the memory cell 35 is performed in a program-verification cycle VC3 according to a program-verification level PV, and it is made a decision HC0 about whether the program-verification VA3 passes. For instance, the memory cell 35 is compared to a reference representative having the program-verification level PV corresponding to the specific state STB, wherein the program-verification level PV may be one of the program-verification levels PV1, PV2 and PV3.

In step 424, the step flow proceeds to step 426 when the decision HC0 is positive, and the step flow proceeds to step 428 when the decision HC0 is negative. In step 426, the third-phase program process HP3 is ended.

In step 428, the plurality of bias voltage levels BB11, BB21, BB31 and BB41 are stepped up to a plurality of bias voltage levels BB12, BB22, BB32 and BB42, respectively, the bias voltage BV3 for programming the memory cell 35 is caused to have a specific one BBB of the plurality of bias voltage levels BB12, BB22, BB32 and BB42 according to the mark GA1, and the step flow goes back to step 420. The plurality of bias voltage levels BB12, BB22, BB32 and BB42 are different from one another. The specific bias voltage level BBB is the bias voltage level BB12 (BB22, BB32 or BB42 in order) when the mark GA1 indicates that the memory cell 35 belongs to the memory cell group GP1 (GP2, GP3 or GP4 in order). For instance, step 428 may be performed when the step-up condition is preset; and the plurality of bias voltage levels BB12, BB22, BB32 and BB42 may be equal to the plurality of bias voltage levels BB11, BB21, BB31 and BB41, respectively, when the level-fixed condition is preset.

In one embodiment, the method 400 may be applied to each of the plurality of memory cells 35, 36, 37 and 38. In one embodiment, the method 400 may be applied to a memory cell the destination state of which is different from the state ST0.

In one embodiment, the program process HP includes the following steps: the first-phase program process HP11 is performed; the second-phase program process HP21 is performed; and the third-phase program process HP3 is performed. In one embodiment, the program process HP includes the first-phase program process HP11 and the third-phase program process HP3, and the second-phase program process HP21 is omitted.

Figure 7:
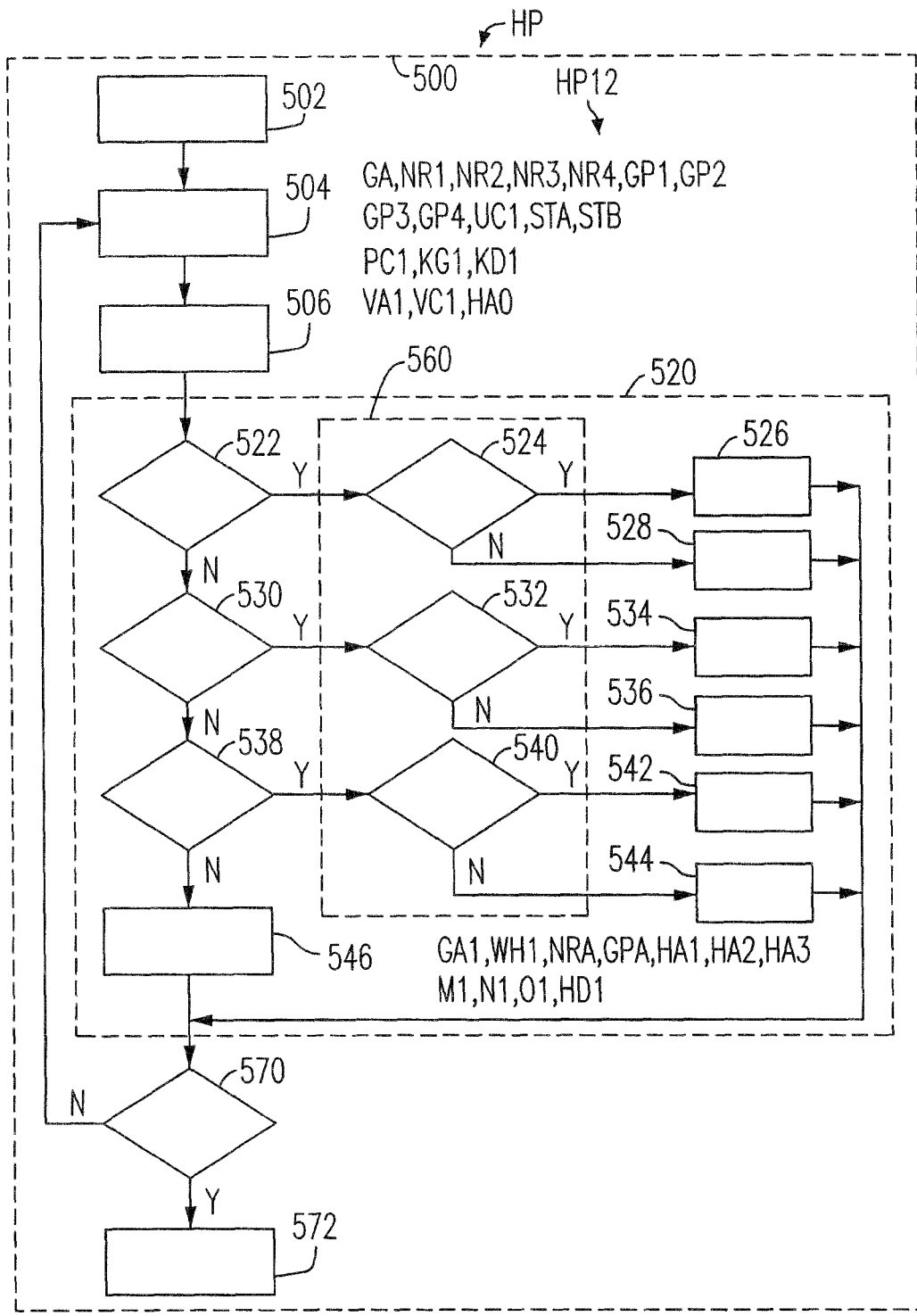
FIG. 7 is a flow diagram showing a method serving as a first-phase program process according to one embodiment of the present disclosure.

FIG. 7 is a flow diagram showing a method 500 serving as a first-phase program process HP12 according to one embodiment of the present disclosure. The method 500 is another implementation of the method 200. In step 502, a grouping information GA, a plurality of cycle number ranges NR1, NR2, NR3 and NR4, and a plurality of memory cell groups GP1, GP2, GP3 and GP4 are preset up, a current program-verification cycle number UC1 is preset to be a number of 0, and the first-phase program process HP12 is started. The first-phase program process HP12 is a partial process of the program process HP. The program process HP is employed to program the memory cell 35 from a specific one STA of the states ST0, ST1, ST2 and ST3 to a specific one STB of the states ST0, ST1, ST2 and ST3, wherein the specific state STB being a destination state is different from the specific state STA being a source state. The memory cell 35 has a selected bit site to be programmed for the specific state STB and a neighbor bit site of the selected bit site.

In step 504, the memory cell 35 is programmed in a program cycle PC1, wherein the memory cell 35 may be a multi-level cell or a charge-trapping memory cell. For instance, in the program cycle PC1, a pulse KG1 is applied to the gate terminal of the memory cell 35, a pulse KD1 is applied to the drain terminal of the memory cell 35, and the source terminal of the memory cell 35 is coupled to the ground, so that the threshold voltage $V_T$ of the memory cell 35 can be increased.

In step 506, the current program-verification cycle number UC1 is increased by 1, a program-verification VA1 to the memory cell 35 is performed in a program-verification cycle VC1 according to a program-verification level PV''', and it is made a decision HA0 about whether the program-verification VA1 passes. For instance, the memory cell 35 is compared to a reference representative having the program-verification level PV''' corresponding to the specific state STB, wherein the program-verification level PV''' may be one of the program-verification levels PV1''', PV2''' and PV3'''.

In the process 520, the grouping information GA is caused to have a mark GA1, which is set according to the current program-verification cycle number UC1, a plurality of cycle number ranges NR1, NR2, NR3 and NR4, and a characteristic WH1 associated with programming the memory cell 35, wherein the mark GA1 indicates that the memory cell 35 belongs to a specific one GPA of the plurality of memory cell groups GP1, GP2, GP3 and GP4. In one embodiment, the grouping information GA is adjustable according to an additional information about programming the memory cell 35; and the additional information is formed from the characteristic WH1. For instance, the additional information includes a neighbor bit information. In one embodiment, the mark GA1 is set according to the current program-verification cycle number UC1 and the plurality of cycle number ranges NR1, NR2, NR3 and NR4, and is adjustable according to the characteristic WH1, wherein the specific memory cell group GPA is changed to be another memory cell group of the plurality of memory cell groups GP1, GP2, GP3 and GP4 when the mark GA1 is adjusted.

The process 520 includes the sub-process 560 and steps 522, 526, 528, 530, 534, 536, 538, 542, 544 and 546, wherein the sub-process 560 includes steps 524, 532 and 540, and is associated with the characteristic WH1. The memory cell 35 has the neighbor bit site having a logical voltage level. For instance, the characteristic WH1 includes the logical voltage level of the neighbor bit site.

In step 522, it is made a decision HA1 about whether the decision HA0 is positive and the current program-verification cycle number UC1 is within the cycle number range NR1. For instance, the cycle number range NR1 is a first integer range, which is greater than a specific integer of 0 and is less than or equal to a specific integer M1. The step flow proceeds to step 530 when the decision HA1 is negative. The step flow proceeds to step 524 when the decision HA1 is positive.

In step 524, it is made a decision HD1 about whether the logical voltage level of the neighbor bit site is high. The step flow proceeds to step 526 when the decision HD1 is positive. The step flow proceeds to step 528 when the decision HD1 is negative. In step 526, the mark GA1 is set to indicate that the memory cell 35 joins the memory cell group GP2. In step 528, the mark GA1 is set to indicate that the memory cell 35 joins the memory cell group GP1.

In step 530, it is made a decision HA2 about whether the decision HA0 is positive and the current program-verification cycle number UC1 is within the cycle number range NR2. For instance, the cycle number range NR2 is a second integer range, which is greater than the specific integer M1 and is less than or equal to a specific integer N1. The step flow proceeds to step 538 when the decision HA2 is negative. The step flow proceeds to step 532 when the decision HA2 is positive.

In step 532, the step flow proceeds to step 534 when the decision HD1 is positive, and the step flow proceeds to step 536 when the decision HD1 is negative. In step 534, the mark GA1 is set to indicate that the memory cell 35 joins the memory cell group GP3. In step 536, the mark GA1 is set to indicate that the memory cell 35 joins the memory cell group GP2.

In step 538, it is made a decision HA3 about whether the decision HA0 is positive and the current program-verification cycle number UC1 is within the cycle number range NR3. For instance, the cycle number range NR3 is a third integer range, which is greater than the specific integer N1 and is less than or equal to a specific integer O1. The step flow proceeds to step 546 when the decision HA3 is negative. The step flow proceeds to step 540 when the decision HA3 is positive.

In step 540, the step flow proceeds to step 542 when the decision HD1 is positive, and the step flow proceeds to step 544 when the decision HD1 is negative. In step 542, the mark GA1 is set to indicate that the memory cell 35 joins the memory cell group GP4. In step 544, the mark GA1 is set to indicate that the memory cell 35 joins the memory cell group GP3.

In step 546, the mark GA1 is set to indicate that the memory cell 35 join the memory cell group GP4. In step 546, there is a condition the current program-verification cycle number UC1 is within the cycle number range NR4. For instance, the cycle number range NR4 is a fourth integer range, which is greater than the specific integer O1.

In step 570, the step flow proceeds to step 572 when the decision HA0 is positive, and the step flow go back to step 504 when the decision HA0 is negative. In step 572, the first-phase program process HP12 is ended.

Figure 8:
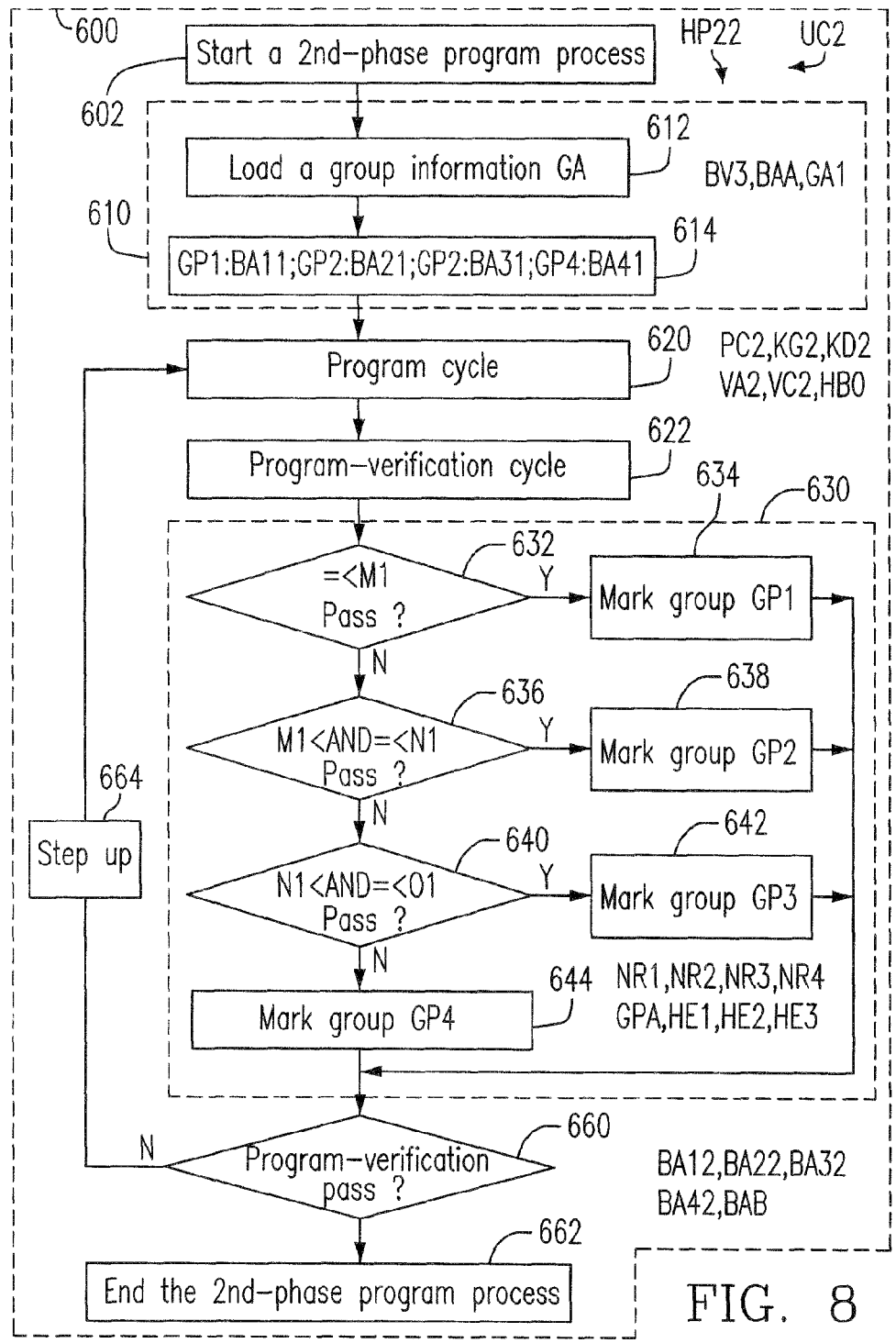
FIG. 8 is a flow diagram showing a method serving as a second-phase program process according to one embodiment of the present disclosure.

FIG. 8 is a flow diagram showing a method 600 serving as a second-phase program process HP22 according to one embodiment of the present disclosure. The method 600 is another implementation of the method 300. In step 602, a current program-verification cycle number UC2 is preset to be a number of 0, and the second-phase program process HP22 is started.

In step 610, a bias voltage BV3 is provided to the drain terminal of the memory cell 35 according to the grouping information GA. Step 610 includes steps 612 and 614. In step 612, the grouping information GA is loaded for each memory cell (such as the memory cell 35) to be programmed in the memory block 19.

In step 614, the bias voltage BV3 for programming the memory cell 35 is caused to have a specific one BAA of a plurality of bias voltage levels BA11, BA21, BA31 and BA41 according to the mark GA1. The plurality of bias voltage levels BA11, BA21, BA31 and BA41 are different from one another. The specific bias voltage level BAA is the bias voltage level BA11 (BA21, BA31 or BA41 in order) when the mark GA1 indicates that the memory cell 35 belongs to the memory cell group GP1 (GP2, GP3 or GP4 in order).

In step 620, the memory cell 35 is programmed in a program cycle PC2. For instance, in the program cycle PC2, a pulse KG2 is applied to the gate terminal of the memory cell 35, a pulse KD2 having a pulse height KH2 equal to the specific bias voltage level BAA is applied to the drain terminal of the memory cell 35, and the source terminal of the memory cell 35 is coupled to the ground, so that the threshold voltage $V_T$ of the memory cell 35 can be increased. For instance, a pulse height of the pulse KG2 may be higher than a pulse height of the pulse KG1.

In step 622, the current program-verification cycle number UC2 is increased by 1, a program-verification VA2 to the memory cell 35 is performed in a program-verification cycle VC2 according to a program-verification level PV', and it is made a decision HB0 about whether the program-verification VA2 passes. For instance, the memory cell 35 is compared to a reference representative having the program-verification level PV' corresponding to the specific state STB, wherein the program-verification level PV' may be one of the program-verification levels PV1', PV2' and PV3'.

In the process 630, the mark GA1 is caused to be adjustable according to the current program-verification cycle number UC2 and a plurality of cycle number ranges NR1, NR2, NR3 and NR4, wherein the mark GA1 indicates that the memory cell 35 belongs to a specific one GPA of the plurality of memory cell groups GP1, GP2, GP3 and GP4, and the specific one GPA is changed to be another memory cell group of the plurality of memory cell groups GP1, GP2, GP3 and GP4 when the mark GA1 is adjusted. The process 630 includes steps 632, 634, 636, 638, 640, 642 and 644.

In step 632, it is made a decision HE1 about whether the decision HB0 is positive and the current program-verification cycle number UC2 is within the cycle number range NR1. For instance, the cycle number range NR1 is a first integer range, which is greater than a specific integer of 0 and is less than or equal to a specific integer M1. The step flow proceeds to step 634 when the decision HE1 is positive. The step flow proceeds to step 636 when the decision HE1 is negative. In step 634, the mark GA1 is set to indicate that the memory cell 35 joins the memory cell group GP1.

In step 636, it is made a decision HE2 about whether the decision HB0 is positive and the current program-verification cycle number UC2 is within the cycle number range NR2. For instance, the cycle number range NR2 is a second integer range, which is greater than the specific integer M1 and is less than or equal to a specific integer N1. The step flow proceeds to step 638 when the decision HE2 is positive. The step flow proceeds to step 640 when the decision HE2 is negative. In step 638, the mark GA1 is set to indicate that the memory cell 35 joins the memory cell group GP2.

In step 640, it is made a decision HE3 about whether the decision HB0 is positive and the current program-verification cycle number UC2 is within the cycle number range NR3. For instance, the cycle number range NR3 is a third integer range, which is greater than the specific integer N1 and is less than or equal to a specific integer O1. The step flow proceeds to step 642 when the decision HE3 is positive. The step flow proceeds to step 644 when the decision HE3 is negative. In step 642, the mark GA1 is set to indicate that the memory cell 35 joins the memory cell group GP3.

In step 644, the mark GA1 is set to indicate that the memory cell 35 joins the memory cell group GP4. In step 644, there is a condition the current program-verification cycle number UC2 is within the cycle number range NR4. For instance, the cycle number range NR4 is a fourth integer range, which is greater than the specific integer O1.

In step 660, the step flow proceeds to step 662 when the decision HB0 is positive, and the step flow proceeds to step 664 when the decision HB0 is negative. In step 662, the second-phase program process HP22 is ended.

In step 664, the plurality of bias voltage levels BA11, BA21, BA31 and BA41 are stepped up to a plurality of bias voltage levels BA12, BA22, BA32 and BA42, respectively, the bias voltage BV3 for programming the memory cell 35 is caused to have a specific one BAB of the plurality of bias voltage levels BA12, BA22, BA32 and BA42 according to the mark GA1, and the step flow goes back to step 620. The plurality of bias voltage levels BA12, BA22, BA32 and BA42 are different from one another. The specific bias voltage level BAB is the bias voltage level BA12 (BA22, BA32 or BA42 in order) when the mark GA1 indicates that the memory cell 35 belongs to the memory cell group GP1 (GP2, GP3 or GP4 in order).

Figure 9:
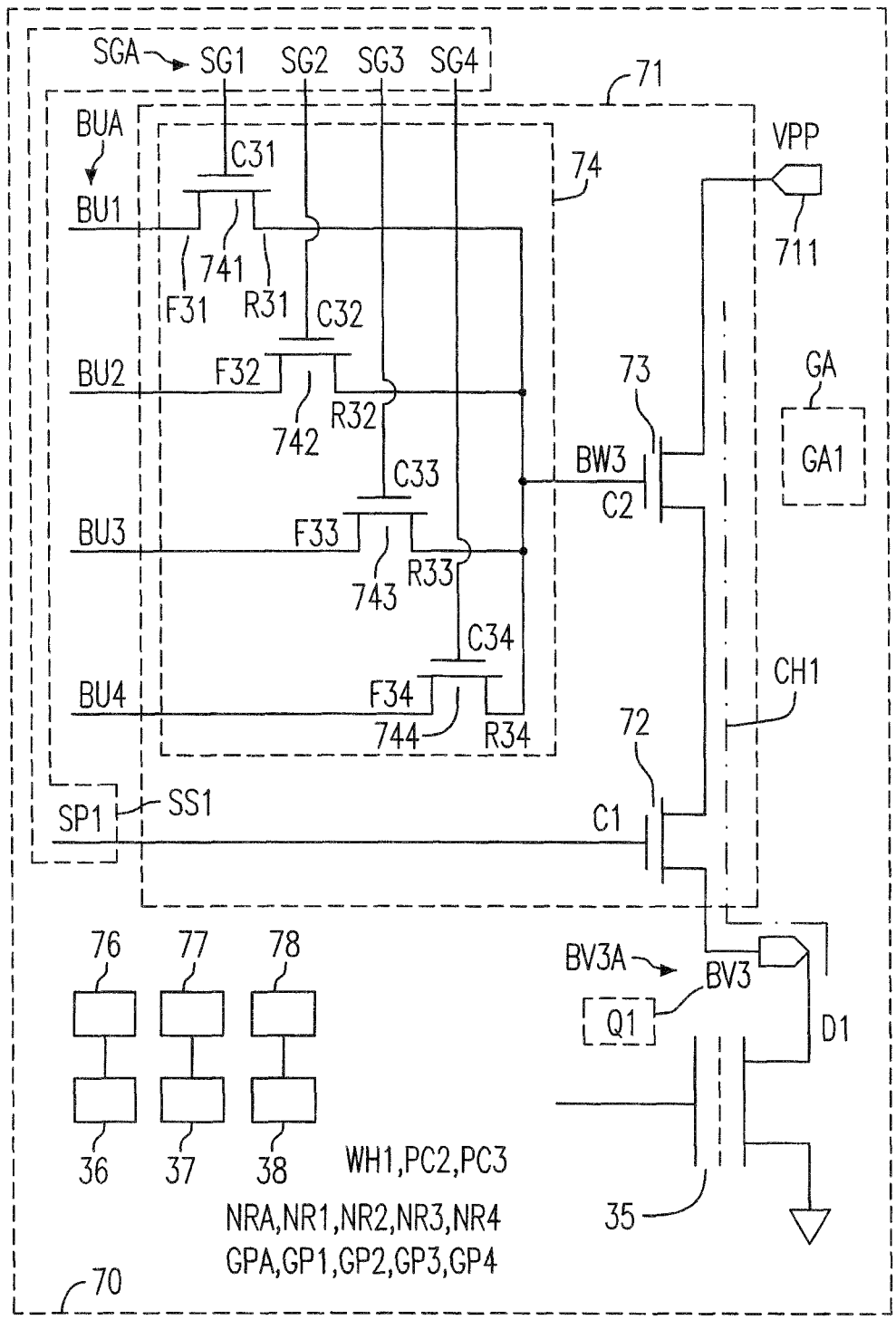
FIG. 9 is a schematic diagram showing a memory device according to one embodiment of the present disclosure.

FIG. 9 is a schematic diagram showing a memory device 70 according to one embodiment of the present disclosure. The memory device 70 includes a memory cell 35 and a bias circuit 71 coupled to the memory cell 35. The bias circuit 71 has a controllable channel CH1, receives a plurality of bias voltages BU1, BU2, BU3 and BU4 different from one another, and allows a specific one BUA (such as BU2) of the plurality of bias voltages BU1, BU2, BU3 and BU4 to enable the controllable channel CH1 for programming the memory cell 35. For instance, the memory device 70, the memory cell 35 and the bias circuit 71 are a non-volatile memory device, a non-volatile memory cell and a drain bias circuit, respectively.

In one embodiment, the memory device 70 further includes a grouping information GA and a plurality of memory cell groups GP1, GP2, GP3 and GP4. The grouping information GA includes a mark GA1, which indicates that the memory cell 35 having a drain terminal D1 belongs to a specific one GPA of the plurality of memory cell groups GP1, GP2, GP3 and GP4. The plurality of bias voltages BU1, BU2, BU3 and BU4 correspond to the plurality of memory cell groups GP1, GP2, GP3 and GP4, respectively, and are different from one another according to the plurality of memory cell groups GP1, GP2, GP3 and GP4. For instance, the plurality of bias voltages BU1, BU2, BU3 and BU4 have four voltage levels, respectively, which correspond to the plurality of memory cell groups GP1, GP2, GP3 and GP4, respectively, and are different from one another according to the plurality of memory cell groups GP1, GP2, GP3 and GP4.

The controllable channel CH1 is enabled to apply a bias voltage BV3 to the drain terminal D1 for programming the memory cell 35. For instance, the bias voltage BV3 is a drain bias voltage BV3A. The bias circuit 71 includes a power input terminal 711 and a switch 72, and receives a selection signal SS1. The specific bias voltage BUA is allowed to enable the controllable channel CH1 according to the selection signal SS1, wherein the selection signal SS1 includes a program data signal SP1 and a plurality of group mark signals SG1, SG2, SG3 and SG4 corresponding to the plurality of memory cell groups GP1, GP2, GP3 and GP4, respectively.

In one embodiment, the plurality of group mark signals SG1, SG2, SG3 and SG4 include a specific group mark signal SGA corresponding to the specific memory cell group GPA. Only the specific group mark signal SGA in the plurality of group mark signals SG1, SG2, SG3 and SG4 has an enable voltage level. For instance, during a specific program cycle of the memory cell 35, the specific group mark signal SGA has the enable voltage level and the other group mark signals in the plurality of group mark signals SG1, SG2, SG3 and SG4 have disable voltage levels, respectively. The switch 72 is coupled between the power input terminal 711 and the drain terminal D1, and includes a control terminal C1 receiving the program data signal SP1. For instance, the power input terminal 711 receives a programming reference voltage VPP; the switch 72 is a pass transistor; and the program data signal SP1 is an enable signal or a pulse signal. The specific bias voltage BUA corresponds to the specific memory cell group GPA.

In one embodiment, the bias circuit 71 further includes a transistor 73 coupled to the switch 72 and a selection circuit 74 coupled to the transistor 73. The transistor 73 is coupled between the power input terminal 711 and the drain terminal D1, is connected in series with the switch 72, and includes a control terminal C2 receiving a bias voltage BW3, wherein the controllable channel CH1 passes through the transistor 73 and the switch 72. The selection circuit 74 receives the plurality of bias voltages BU1, BU2, BU3 and BU4 and the plurality of group mark signals SG1, SG2, SG3 and SG4, and selects the specific bias voltage BUA from the plurality of bias voltages BU1, BU2, BU3 and BU4 to convert the specific bias voltage BUA into the bias voltage BW3 in response to the plurality of group mark signals SG1, SG2, SG3 and SG4.

In one embodiment, the selection circuit 74 includes a plurality of switches 741, 742, 743 and 744 corresponding to the plurality of memory cell groups GP1, GP2, GP3 and GP4, respectively. For instance, the plurality of switches 741, 742, 743 and 744 are a plurality of pass transistors, respectively. The plurality of switches 741, 742, 743 and 744 include a plurality of control terminals C31, C32, C33 and C34, respectively, further include a plurality of transmission terminals F31, F32, F33 and F34, respectively, and further include a plurality of transmission terminals R31, R32, R33 and R34, respectively. The plurality of control terminals C31, C32, C33 and C34 receive the plurality of group mark signals SG1, SG2, SG3 and SG4, respectively. The plurality of transmission terminals F31, F32, F33 and F34 receive the plurality of bias voltages BU1, BU2, BU3 and BU4, respectively. Each of the plurality of transmission terminals R31, R32, R33 and R34 is coupled to the control terminal C2.

In one embodiment, each of the methods 300 and 600 may use the bias circuit 71 to program the memory cell 35 in the program cycle PC2. In one embodiment, the methods 400 may use the bias circuit 71 to program the memory cell 35 in the program cycle PC3. In one embodiment, the memory device 70 further includes memory cells 36, 37 and 38, and bias circuits 76, 77 and 78 coupled to the memory cells 36, 37 and 38, respectively. The memory cells 36, 37 and 38 have a first structure, a second structure and a third structure, respectively. Each of the first, the second and the third structures are the same as the structure of the bias circuit 71.

In one embodiment, the bias voltage BV3 includes a programming pulse train Q1 being in one selected from a first state, a second state and a third state. The first state is that the programming pulse train Q1 has a first pulse amplitude being linearly stable. The second state is that the programming pulse train Q1 has a second pulse amplitude linearly increasing in a first staircase form. The third state is that the programming pulse train Q1 has a third pulse amplitude nonlinearly increasing in a second staircase form.

In one embodiment, the programming pulse train Q1 has a first pulse height in a specific program cycle (such as PC2 or PC3) of the memory cell 35 when the specific memory cell group GPA is the memory cell group GP1. The programming pulse train Q1 has a second pulse height in the specific program cycle (such as PC2 or PC3) of the memory cell 35 when the specific memory cell group GPA is the memory cell group GP2. The programming pulse train Q1 has a third pulse height in the specific program cycle (such as PC2 or PC3) of the memory cell 35 when the specific memory cell group GPA is the memory cell group GP3. The programming pulse train Q1 has a fourth pulse height in the specific program cycle (such as PC2 or PC3) of the memory cell 35 when the specific memory cell group GPA is the memory cell group GP4. The first, the second, the third and the fourth pulse heights are different.

In one embodiment, the memory cell 35 is programmed and verified to determine a specific one NRA of a plurality of cycle number ranges NR1, NR2, NR3 and NR4, in which the memory cell 35 passes a program-verification VA1. The plurality of cycle number ranges NR1, NR2, NR3 and NR4 correspond to the plurality of memory cell groups GP1, GP2, GP3 and GP4, respectively. The memory cell 35 is marked to belong to the specific memory cell group GPA according to the specific cycle number range NRA. The memory cell 35 is programmed with a characteristic WH1. Each of the bias voltage BV3 and the specific memory cell group GPA is adjustable according to the characteristic WH1.

Figure 10:
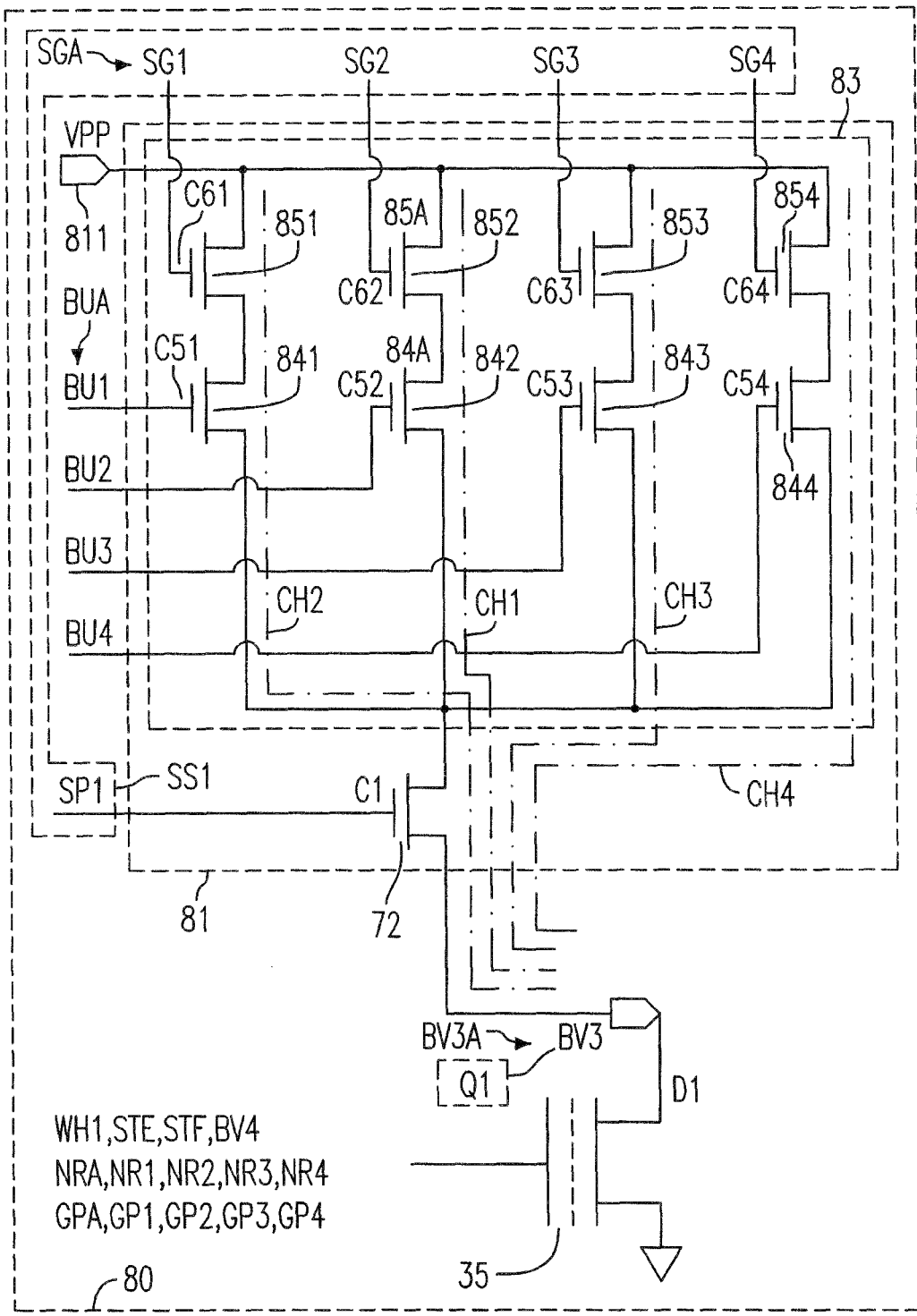
FIG. 10 is a schematic diagram showing a memory device according to one embodiment of the present disclosure.

FIG. 10 is a schematic diagram showing a memory device 80 according to one embodiment of the present disclosure. The memory device 80 includes a memory cell 35 and a bias circuit 81 coupled to the memory cell 35. The bias circuit 81 is another circuit for implementing the bias circuit 71. The bias circuit 81 has a controllable channel CH1, receives a plurality of bias voltages BU1, BU2, BU3 and BU4 different from one another, and allows a specific one BUA (such as BU2) of the plurality of bias voltages BU1, BU2, BU3 and BU4 to enable the controllable channel CH1 for programming the memory cell 35. For instance, the memory device 80, the memory cell 35 and the bias circuit 81 are a non-volatile memory device, a non-volatile memory cell and a drain bias circuit, respectively.

In one embodiment, the memory device 80 further includes a grouping information GA and a plurality of memory cell groups GP1, GP2, GP3 and GP4. The grouping information GA includes a mark GA1, which indicates that the memory cell 35 having a drain terminal D1 belongs to a specific one GPA of the plurality of memory cell groups GP1, GP2, GP3 and GP4. The plurality of bias voltages BU1, BU2, BU3 and BU4 correspond to the plurality of memory cell groups GP1, GP2, GP3 and GP4, respectively, and are different from one another according to the plurality of memory cell groups GP1, GP2, GP3 and GP4. For instance, the plurality of bias voltages BU1, BU2, BU3 and BU4 have four voltage levels, respectively, which correspond to the plurality of memory cell groups GP1, GP2, GP3 and GP4, respectively, and are different from one another according to the plurality of memory cell groups GP1, GP2, GP3 and GP4.

The controllable channel CH1 is enabled to apply a bias voltage BV3 to the drain terminal D1 for programming the memory cell 35. For instance, the bias voltage BV3 is a drain bias voltage BV3A. The bias circuit 81 includes a power input terminal 811 and a switch 72, and receives a selection signal SS1. The specific bias voltage BUA is allowed to enable the controllable channel CH1 according to the selection signal SS1, wherein the selection signal SS1 includes a program data signal SP1 and a plurality of group mark signals SG1, SG2, SG3 and SG4 corresponding to the plurality of memory cell groups GP1, GP2, GP3 and GP4, respectively.

In one embodiment, the plurality of group mark signals SG1, SG2, SG3 and SG4 include a specific group mark signal SGA corresponding to the specific memory cell group GPA. Only the specific group mark signal SGA in the plurality of group mark signals SG1, SG2, SG3 and SG4 has an enable voltage level during a program cycle of the memory cell 35. The switch 72 is coupled between the power input terminal 811 and the drain terminal D1, and includes a control terminal C1 receiving the program data signal SP1. For instance, the power input terminal 811 receives a programming reference voltage VPP; the switch 72 is a pass transistor; and the program data signal SP1 is an enable signal or a pulse signal. The specific bias voltage BUA corresponds to the specific memory cell group GPA.

In one embodiment, the bias circuit 81 further includes a selection circuit 83 and at least a controllable channel CH2 coupled to the selection circuit 83. The controllable channel CH1 and the at least a controllable channel CH2 constitute a plurality of controllable channels CH1, CH2, CH3 and CH4 corresponding to the plurality of memory cell groups GP1, GP2, GP3 and GP4, respectively; and the controllable channel CH1 corresponds to the specific memory cell group GPA.

In one embodiment, the selection circuit 83 is coupled between the power input terminal 811 and the drain terminal D1, is connected in series with the switch 72, selects the controllable channel CH1 from the plurality of controllable channels CH1, CH2, CH3 and CH4 and the specific bias voltage BUA from the plurality of bias voltages BU1, BU2, BU3 and BU4 in response to the plurality of group mark signals SG1, SG2, SG3 and SG4, and enables the controllable channel CH1 to provide the bias voltage BV3 in response to the specific bias voltage BUA under the program data signal SP1.

In one embodiment, the selection circuit 83 includes a plurality of transistors 841, 842, 843 and 844 and a plurality of switches 851, 852, 853 and 854 coupled to the plurality of transistors 841, 842, 843 and 844, respectively. For instance, the plurality of switches 851, 852, 853 and 854 are a plurality of pass transistors, respectively. The plurality of transistors 841, 842, 843 and 844 correspond to the plurality of memory cell groups GP1, GP2, GP3 and GP4, respectively, and includes a plurality of control terminals C51, C52, C53 and C54, respectively, wherein the plurality of control terminals C51, C52, C53 and C54 receives the plurality of bias voltages BU1, BU2, BU3 and BU4, respectively.

The plurality of switches 851, 852, 853 and 854 correspond to the plurality of memory cell groups GP1, GP2, GP3 and GP4, respectively, and includes a plurality of control terminals C61, C62, C63 and C64, respectively, wherein the plurality of control terminals C61, C62, C63 and C64 receives the plurality of group mark signals SG1, SG2, SG3 and SG4, respectively. The plurality of transistors 841, 842, 843 and 844 are connected in series with the plurality of switches 851, 852, 853 and 854, respectively. The plurality of switches 851, 852, 853 and 854 include a specific switch 85A corresponding to the specific memory cell group GPA. The plurality of transistors 841, 842, 843 and 844 include a specific transistor 84A corresponding to the specific memory cell group GPA. The controllable channel CH1 passes through the specific switch 85A, the specific transistor 84A and the switch 72.

In one embodiment in reference to FIG. 4 to FIG. 10, a method for programming a memory cell 35 of a memory device 70 or 80 is provided. The method includes the following steps. A plurality of cycle number ranges NR1, NR2, NR3 and NR4 are set up. A specific one NRA of the plurality of cycle number ranges NR1, NR2, NR3 and NR4, in which the memory cell 35 having a drain terminal D1 passes a program-verification VA1, is determined. A bias voltage BV3 is applied to the drain terminal D1 for programming the memory cell 35, wherein the bias voltage BV3 varies with the specific cycle number range NRA.

In one embodiment, the memory cell 35 is programmed with a characteristic WH1, and the method further includes the following steps. A plurality of memory cell groups GP1, GP2, GP3 and GP4 for the memory device 80 are set up, wherein the plurality of memory cell groups GP1, GP2, GP3 and GP4 correspond to the plurality of cycle number ranges NR1, NR2, NR3 and NR4, respectively. The memory cell 35 is caused to join a specific one GPA of the plurality of memory cell groups GP1, GP2, GP3 and GP4 corresponding to the specific cycle number range NR1, NR2, NR3 and NR4, wherein each of the bias voltage BV3 and the specific memory cell group GPA is adjustable according to the characteristic WH1, the memory cell 35 further has a neighbor bit site having a logical voltage level, and the characteristic WH1 includes the logical voltage level.

In one embodiment, the method further includes the following steps. A controllable channel CH1 is provided. A selection signal SS1 including a plurality of group mark signals SG1, SG2, SG3 and SG4 is provided, wherein the plurality of group mark signals SG1, SG2, SG3 and SG4 correspond to the plurality of memory cell groups GP1, GP2, GP3 and GP4, respectively. A plurality of bias voltages BU1, BU2, BU3 and BU4 different from one another and corresponding respectively to the plurality of memory cell groups GP1, GP2, GP3 and GP4 are provided, wherein the plurality of bias voltages BU1, BU2, BU3 and BU4 include a specific bias voltage BUA corresponding to the specific memory cell group GPA. The controllable channel CH1 is enabled by the specific bias voltage BUA according to the selection signal SS1 to provide the bias voltage BV3, wherein the selection signal SS1 includes a program data signal SP1 and the plurality of group mark signals SG1, SG2, SG3 and SG4, the plurality of group mark signals SG1, SG2, SG3 and SG4 include a specific group mark signal SGA corresponding to the specific memory cell group GPA, and only the specific group mark signal GPA in the plurality of group mark signals SG1, SG2, SG3 and SG4 has an enable voltage level.

In one embodiment, the memory cell 35 is programmed from a state STE (such as the state ST0 or the specific state STA) to a state STF (such as the state ST1 or the specific state STB) associated with a predetermined program-verification voltage level (such as the program-verification voltage level PV1). Determining a specific one NRA of the plurality of cycle number ranges NR1, NR2, NR3 and NR4 is performed according to a specific program-verification voltage level (such as the program-verification voltage level PV1"), and may includes a process of applying a bias voltage BV4 to the drain terminal D1 of the memory cell 35. The bias voltage BV4 includes a programming pulse train. For instance, the programming pulse train of the bias voltage BV4 has a pulse amplitude being linearly stable or linearly increasing or non-linearly increasing. The specific program-verification voltage level (such as the program-verification voltage level PV1") is less than the predetermined program-verification voltage level (such as the program-verification voltage level PV1) and is associated with the state STF. Under a condition that the bias voltage BV3 is applied to the drain terminal D1, the memory cell 35 is programmed and verified according to the predetermined program-verification voltage level (such as the program-verification voltage level PV1).

In one embodiment in reference to FIG. 4 to FIG. 10, a method for programming a memory cell 35 of a memory device 70 or 80 is provided. The method includes the following steps. A plurality of cycle number ranges NR1, NR2, NR3 and NR4 are set up. A specific one NRA of the plurality of cycle number ranges NR1, NR2, NR3 and NR4 is determined, in which the memory cell 35 having a drain terminal D1 passes a program-verification VA1. The method may further include a step of applying a bias voltage BV3 to the drain terminal D1 for programming the memory cell 35, wherein the bias voltage BV3 varies with the specific cycle number range NRA.

In one embodiment, the memory device 70 or 80 can achieve the effect of speeding up the program speed. In the memory device 70 or 80 having a memory array, more than one drain side bias is used to program the memory array in the same program cycle. Slow program bits in the memory array have higher drain side program biases; and fast program bits in the memory array have lower drain side program biases. Therefore, during one program pulse time, different program cells have similar program efficiencies. After the program shots are reduced, the program-verification cycles are also decreased. The program speed of the memory device 70 or 80 can be improved due to less program cycles and less program-verification cycles.

FIG. 11A is a schematic diagram showing a waveform WP1 of a drain bias voltage BV1 obtained from the memory device 10 in FIG. 3 under a first condition according to one embodiment of the present disclosure. FIG. 11B is a schematic diagram showing four waveforms WQ11, WQ12, WQ13 and WQ14 of a drain bias voltage BV3A obtained from the memory device in FIG. 9 or FIG. 10 under a second condition associated with the first condition according to one embodiment of the present disclosure. The waveform WP1 in FIG. 11A shows that the drain bias voltage BV1 has a programming pulse train QE. The programming pulse train QE has a pulse amplitude being linearly stable, and a pulse PE in a specific program cycle PCA.

The waveform WQ11 in FIG. 11B shows that: the drain bias voltage BV3A has a programming pulse train Q51 when the mark GA1 indicates that the memory cell 35 belongs to the memory cell group GP1. The waveform WQ12 shows that the drain bias voltage BV3A has a programming pulse train Q52 when the mark GA1 indicates that the memory cell 35 belongs to the memory cell group GP2. The waveform WQ13 shows that the drain bias voltage BV3A has a programming pulse train Q53 when the mark GA1 indicates that the memory cell 35 belongs to the memory cell group GP3. The waveform WQ14 shows that the drain bias voltage BV3A has a programming pulse train Q54 when the mark GA1 indicates that the memory cell 35 belongs to the memory cell group GP4. Each of the programming pulse trains Q51, Q52, Q53 and Q54 has a respective pulse amplitude being linearly stable. The programming pulse trains Q51, Q52, Q53 and Q54 have pulses P51, P52, P53 and P54 in the specific program cycle PCA, respectively. The pulses P51, P52, P53 and P54 have different pulse heights.

Figure 12A:
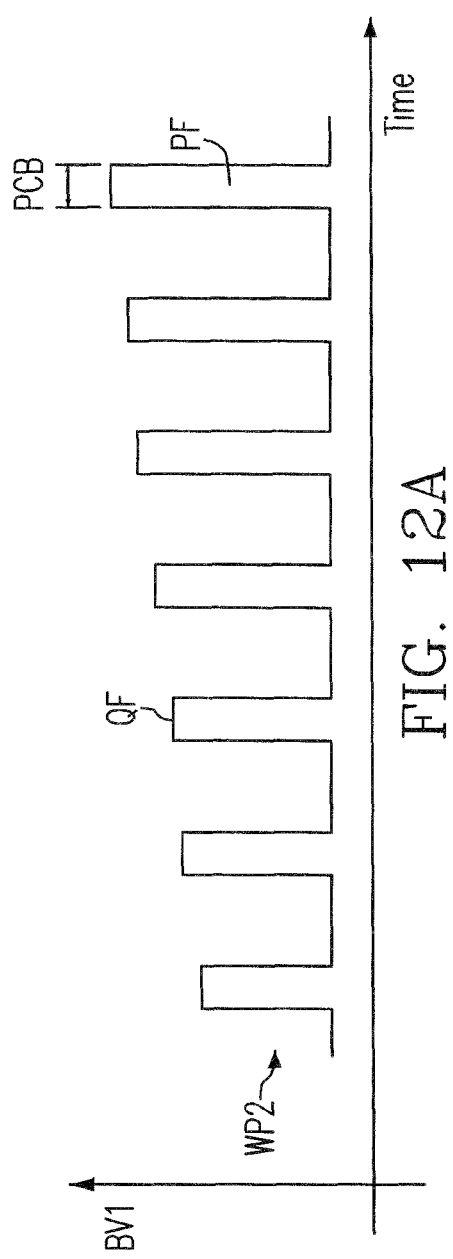
FIG. 12A is a schematic diagram showing a waveform of the drain bias voltage obtained from the memory device in FIG. 3 under a third condition according to one embodiment of the present disclosure.
Figure 12B:
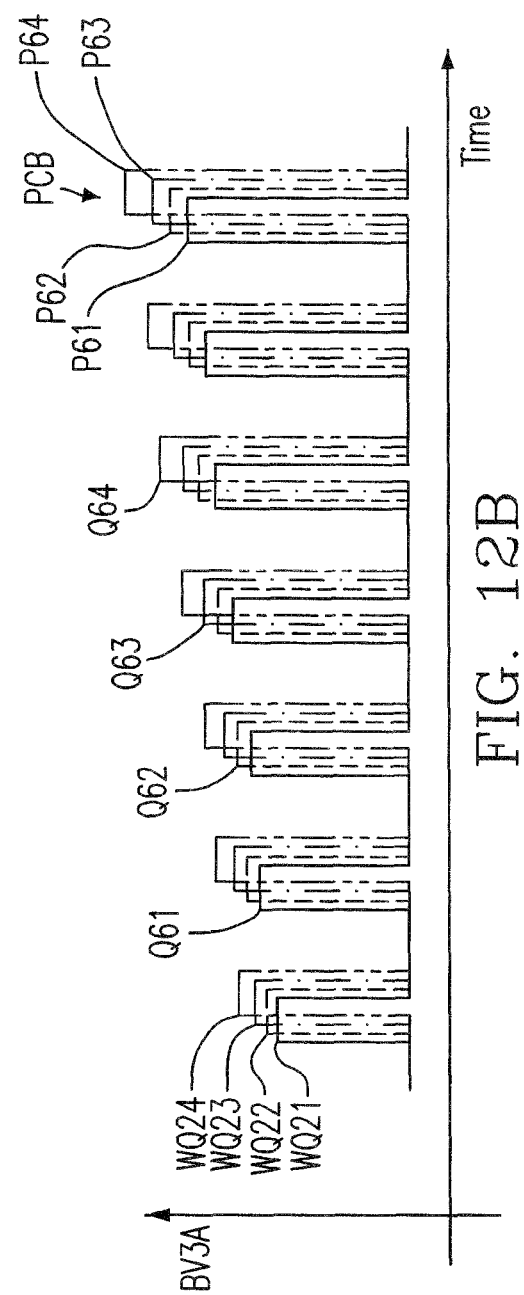
FIG. 12B is a schematic diagram showing four waveforms of a drain bias voltage obtained from the memory device in FIG. 9 or FIG. 10 under a fourth condition associated with the third condition according to one embodiment of the present disclosure.

FIG. 12A is a schematic diagram showing a waveform WP2 of the drain bias voltage BV1 obtained from the memory device 10 in FIG. 3 under a third condition according to one embodiment of the present disclosure. FIG. 12B is a schematic diagram showing four waveforms WQ21, WQ22, WQ23 and WQ24 of a drain bias voltage BV3A obtained from the memory device in FIG. 9 or FIG. 10 under a fourth condition associated with the third condition according to one embodiment of the present disclosure. The waveform WP2 in FIG. 12A shows that the drain bias voltage BV1 has a programming pulse train QF. The programming pulse train QF has a pulse amplitude linearly increasing in a first staircase form, and a pulse PF in a specific program cycle PCB. For instance, the programming pulse train QF is a step-up pulse train.

The waveform WQ21 in FIG. 12B shows that: the drain bias voltage BV3A has a programming pulse train Q61 when the mark GA1 indicates that the memory cell 35 belongs to the memory cell group GP1. The waveform WQ22 shows that the drain bias voltage BV3A has a programming pulse train Q62 when the mark GA1 indicates that the memory cell 35 belongs to the memory cell group GP2. The waveform WQ23 shows that the drain bias voltage BV3A has a programming pulse train Q63 when the mark GA1 indicates that the memory cell 35 belongs to the memory cell group GP3. The waveform WQ24 shows that the drain bias voltage BV3A has a programming pulse train Q64 when the mark GA1 indicates that the memory cell 35 belongs to the memory cell group GP4. Each of the programming pulse trains Q61, Q62, Q63 and Q64 has a respective pulse amplitude linearly increasing in a second staircase form. The programming pulse trains Q61, Q62, Q63 and Q64 have pulses P61, P62, P63 and P64 in the specific program cycle PCB, respectively. The pulses P61, P62, P63 and P64 have different pulse heights.

FIG. 13A is a schematic diagram showing a waveform WP3 of the drain bias voltage BV1 under a fifth condition obtained from the memory device 10 in FIG. 3 according to one embodiment of the present disclosure. FIG. 13B is a schematic diagram showing four waveforms WQ31, WQ32, WQ33 and WQ34 of a drain bias voltage BV3A obtained from the memory device in FIG. 9 or FIG. 10 under a sixth condition associated with the fifth condition according to one embodiment of the present disclosure. The waveform WP3 in FIG. 13A shows that the drain bias voltage BV1 has a programming pulse train QG. The programming pulse train QG has a pulse amplitude nonlinearly increasing in a third staircase form, and a pulse PG in a specific program cycle PCC. For instance, the programming pulse train QG is a mixed step-up pulse train.

The waveform WQ31 in FIG. 13B shows that: the drain bias voltage BV3A has a programming pulse train Q71 when the mark GA1 indicates that the memory cell 35 belongs to the memory cell group GP1. The waveform WQ32 shows that the drain bias voltage BV3A has a programming pulse train Q72 when the mark GA1 indicates that the memory cell 35 belongs to the memory cell group GP3. The waveform WQ23 shows that the drain bias voltage BV3A has a programming pulse train Q73 when the mark GA1 indicates that the memory cell 35 belongs to the memory cell group GP3. The waveform WQ34 shows that the drain bias voltage BV3A has a programming pulse train Q74 when the mark GA1 indicates that the memory cell 35 belongs to the memory cell group GP4. Each of the programming pulse trains Q71, Q72, Q73 and Q74 has a respective pulse amplitude nonlinearly increasing in a fourth staircase form. The programming pulse trains Q71, Q72, Q73 and Q74 have pulses P71, P72, P73 and P74 in the specific program cycle PCC, respectively. The pulses P71, P72, P73 and P74 have different pulse heights.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for programming a memory cell of a memory device, the method comprising steps of:
setting up a plurality of cycle number ranges and a current program-verification cycle number;
determining a specific one of the plurality of cycle number ranges, in which the memory cell having a drain terminal passes a program-verification when the current program-verification cycle number is within the specific cycle number range; and
applying a first bias voltage to the drain terminal for programming the memory cell, wherein the first bias voltage varies with the specific cycle number range.

2. The method according to claim 1, wherein the memory cell is programmed with a characteristic, and the method further comprises steps of:
setting up a plurality of memory cell groups for the memory device, wherein the plurality of memory cell groups correspond to the plurality of cycle number ranges, respectively;
causing the memory cell to join a specific one of the plurality of memory cell groups corresponding to the specific cycle number range, wherein each of the first bias voltage and the specific memory cell group is adjustable according to the characteristic, the memory cell further has a neighbor bit site having a logical voltage level, and the characteristic includes the logical voltage level;
providing a first controllable channel;
providing a selection signal including a program data signal and a plurality of group mark signals corresponding to the plurality of memory cell groups, respectively;
providing a plurality of bias voltages different from one another and corresponding to the plurality of memory cell groups, respectively, wherein the plurality of bias voltages include a specific bias voltage corresponding to the specific memory cell group; and
enabling the first controllable channel by the specific bias voltage according to the selection signal to provide the first bias voltage, wherein:
the plurality of group mark signals include a specific group mark signal corresponding to the specific memory cell group; and
only the specific group mark signal in the plurality of group mark signals has an enable voltage level.

3. The method according to claim 2, further comprising steps of:
providing at least a second controllable channel, wherein the first controllable channel and the at least a second controllable channel constitute a plurality of controllable channels corresponding to the plurality of memory cell groups, respectively, and the first controllable channel corresponds to the specific memory cell group;
selecting the first controllable channel from the plurality of controllable channels and the specific bias voltage from the plurality of bias voltages in response to the plurality of group mark signals; and
providing the first bias voltage in response to the specific bias voltage by the first controllable channel.

4. The method according to claim 2, wherein the first bias voltage includes a programming pulse train being in one selected from:
a first state that the programming pulse train has a first pulse amplitude being linearly stable;
a second state that the programming pulse train has a second pulse amplitude linearly increasing in a first staircase form; and
a third state that the programming pulse train has a third pulse amplitude nonlinearly increasing in a second staircase form.

5. The method according to claim 4, wherein:
the plurality of memory cell groups include a first memory cell group and a second memory cell group;
the programming pulse train has a first pulse height in a specific program cycle of the memory cell when the specific memory cell group is the first memory cell group;
the programming pulse train has a second pulse height in the specific program cycle when the specific memory cell group is the second memory cell group; and
the second pulse height is unequal to the first pulse height.

6. The method according to claim 1, wherein:
the memory cell is programmed from a first state to a second state associated with a predetermined program-verification voltage level; and
the step of determining a specific one of the plurality of cycle number ranges is performed according to a specific program-verification voltage level, and comprises a sub-step of applying a second bias voltage to the drain terminal of the memory cell.

7. The method according to claim 6, wherein:
the second bias voltage includes a programming pulse train;
the specific program-verification voltage level is less than the predetermined program-verification voltage level and is associated with the second state; and
under a condition that the first bias voltage is applied to the drain terminal, the memory cell is programmed and verified according to the predetermined program-verification voltage level.

8. A memory device comprising:
a memory cell; and
a bias circuit having a first controllable channel, receiving a plurality of bias voltages different from one another, and a selection signal, and allowing a specific one of the plurality of bias voltages to enable the first controllable channel according to the selection signal for programming the memory cell.

9. The memory device according to claim 8, further comprising a plurality of memory cell groups corresponding to the plurality of bias voltages, respectively, wherein:
the memory cell having a drain terminal belongs to a specific one of the plurality of memory cell groups;
the first controllable channel is enabled to apply a first bias voltage to the drain terminal for programming the memory cell;
the bias circuit is a drain bias circuit, and comprises a power input terminal and a first switch
the selection signal includes a program data signal and a plurality of group mark signals corresponding to the plurality of memory cell groups, respectively;
the plurality of group mark signals include a specific group mark signal corresponding to the specific memory cell group;
only the specific group mark signal in the plurality of group mark signals has an enable voltage level;
the first switch is coupled between the power input terminal and the drain terminal and includes a first control terminal receiving the program data signal; and the specific bias voltage corresponds to the specific memory cell group.

10. The memory device according to claim 9, wherein the bias circuit further comprises:
a first transistor coupled between the power input terminal and the drain terminal, connected in series with the first switch, and including a second control terminal receiving a second bias voltage, wherein the first controllable channel passes through the first transistor and the first switch; and
a selection circuit receiving the plurality of bias voltages and the plurality of group mark signals, and selecting the specific bias voltage from the plurality of bias voltages to convert the specific bias voltage into the second bias voltage in response to the plurality of group mark signals.

11. The memory device according to claim 10, wherein:
the selection circuit comprises a plurality of switches corresponding to the plurality of memory cell groups, respectively;
the plurality of switches include a plurality of control terminals, respectively, further include a first plurality of transmission terminals, respectively, and further include a second plurality of transmission terminals, respectively;
the plurality of control terminals receive the plurality of group mark signals, respectively;
the first plurality of transmission terminals receive the plurality of bias voltages, respectively; and
each of the second plurality of transmission terminals is coupled to the second control terminal.

12. The memory device according to claim 9, wherein the bias circuit further comprises:
at least a second controllable channel, wherein the first controllable channel and the at least a second controllable channel constitute a plurality of controllable channels corresponding to the plurality of memory cell groups, respectively, and the first controllable channel corresponds to the specific memory cell group; and
a selection circuit coupled between the power input terminal and the drain terminal, connected in series with the first switch, selecting the first controllable channel from the plurality of controllable channels and the specific bias voltage from the plurality of bias voltages in response to the plurality of group mark signals, and enabling the first controllable channel to provide the first bias voltage in response to the specific bias voltage under the program data signal.

13. The memory device according to claim 12, wherein the selection circuit comprises:
a plurality of transistors corresponding to the plurality of memory cell groups, respectively, and including a first plurality of control terminals, respectively, wherein the first plurality of control terminals receive the plurality of bias voltages, respectively; and
a plurality of switches corresponding to the plurality of memory cell groups, respectively, and including a second plurality of control terminals, respectively, wherein the second plurality of control terminals receives the plurality of group mark signals, respectively.

14. The memory device according to claim 13, wherein:
the plurality of transistors are connected in series with the plurality of switches, respectively;
the plurality of switches include a specific switch corresponding to the specific memory cell group;
the plurality of transistors include a specific transistor corresponding to the specific memory cell group; and
the first controllable channel passes through the specific switch, the specific transistor and the first switch.

15. The memory device according to claim 9, wherein the first bias voltage includes a programming pulse train being in one selected from:
a first state that the programming pulse train has a first pulse amplitude being linearly stable;
a second state that the programming pulse train has a second pulse amplitude linearly increasing in a first staircase form; and
a third state that the programming pulse train has a third pulse amplitude nonlinearly increasing in a second staircase form.

16. The memory device according to claim 15, wherein:
the plurality of memory cell groups include a first memory cell group and a second memory cell group;
the programming pulse train has a first pulse height in a specific program cycle of the memory cell when the specific memory cell group is the first memory cell group;
the programming pulse train has a second pulse height in the specific program cycle when the specific memory cell group is the second memory cell group; and
the second pulse height is unequal to the first pulse height.

17. The memory device according to claim 9, wherein:
the memory cell is programmed and verified to determine a specific one of a plurality of cycle number ranges, in which the memory cell passes a program-verification;
the plurality of cycle number ranges correspond to the plurality of memory cell groups, respectively;
the memory cell is marked to belong to the specific memory cell group according to the specific cycle number range;
the memory cell is programmed with a characteristic; and
each of the first bias voltage and the specific memory cell group is adjustable according to the characteristic.

18. A method for programming a memory cell of a memory device, the method comprising steps of:
setting up a plurality of cycle number ranges and a current program-verification cycle number; and
determining a specific one of the plurality of cycle number ranges, in which the memory cell having a drain terminal passes a program-verification when the current program-verification cycle number is within the specific cycle number range.

19. The method according to claim 18, wherein the memory cell is programmed with a characteristic, and the method further comprises steps of:
applying a first bias voltage to the drain terminal for programming the memory cell, wherein the first bias voltage varies with the specific cycle number range;
setting up a plurality of memory cell groups for the memory device, wherein the plurality of memory cell groups correspond to the plurality of cycle number ranges, respectively;
causing the memory cell to join a specific one of the plurality of memory cell groups corresponding to the specific cycle number range, wherein each of the first bias voltage and the specific memory cell group is adjustable according to the characteristic;
providing a first controllable channel;
providing a selection signal including a program data signal and a plurality of group mark signals corresponding to the plurality of memory cell groups, respectively;
providing a plurality of bias voltages different from one another and corresponding to the plurality of memory cell groups, respectively, wherein the plurality of bias voltages include a specific bias voltage corresponding to the specific memory cell group; and allowing the specific bias voltage to enable the first controllable channel according to the selection signal for providing the first bias voltage, wherein:

the plurality of group mark signals include a specific group mark signal corresponding to the specific memory cell group; and only the specific group mark signal in the plurality of group mark signals has an enable voltage level.

20. The method according to claim 19, further comprising steps of:

providing at least a second controllable channel, wherein the first controllable channel and the at least a second controllable channel constitute a plurality of controllable channels corresponding to the plurality of memory cell groups, respectively, and the first controllable channel corresponds to the specific memory cell group;

selecting the first controllable channel from the plurality of controllable channels and the specific bias voltage from the plurality of bias voltages in response to the plurality of group mark signals; and enabling the first controllable channel to provide the first bias voltage in response to the specific bias voltage under the program data signal.

* * * * *